US012754676B2

(12) United States Patent
Steiner et al.

(10) Patent No.: US 12,754,676 B2
(45) Date of Patent: Oct. 6, 2026

(54) SYSTEMS AND METHODS FOR HIGH PERFORMANCE READ WITH ROW-TO-ROW THRESHOLD TRACKING IN NVM

(71) Applicant: Kioxia Corporation, Tokyo (JP)

(72) Inventors: Avi Steiner, Tel Aviv (IL); Ofir Kanter, Tel Aviv (IL); Assaf Sella, Tel Aviv (IL); Eviatar Yadai, Tel Aviv (IL); Eyal Nitzan, Tel Aviv (IL); Nimrod Bregman, Tel Aviv (IL); Hanan Weingarten, Tel Aviv (IL)

(73) Assignee: KIOXIA CORPORATION, Tokyo (JP)

( * ) Notice: Subject to any disclaimer, the term of this patent is extended or adjusted under 35 U.S.C. 154(b) by 48 days.

(21) Appl. No.: 18/921,462

(22) Filed: Oct. 21, 2024

(65) Prior Publication Data

US 2026/0079624 A1 Mar. 19, 2026

Related U.S. Application Data

(60) Provisional application No. 63/695,132, filed on Sep. 16, 2024, provisional application No. 63/695,114, filed on Sep. 16, 2024.

(51) Int. Cl.
*G11C 7/12* (2006.01)
*G06F 3/06* (2006.01)

(52) U.S. Cl.
CPC .......... *G06F 3/0613* (2013.01); *G06F 3/0659* (2013.01); *G06F 3/0679* (2013.01); *G11C 7/12* (2013.01)

(58) Field of Classification Search
CPC ........................................................ G11C 7/12
See application file for complete search history.

(56) References Cited

U.S. PATENT DOCUMENTS

| | | | | |
|---|---|---|---|---|
| 8,879,325 B1 | 11/2014 | Bar et al. | | |
| 9,431,118 B1 | 8/2016 | Bar et al. | | |
| 2023/0282255 A1 * | 9/2023 | Ghosh | G11C 7/18 | 365/203 |

* cited by examiner

*Primary Examiner* — Jason Lappas
(74) *Attorney, Agent, or Firm* — Foley & Lardner LLP

(57) ABSTRACT

The present disclosure relates to a flash memory system may include a non-volatile memory and a circuit. The non-volatile memory may include one or more blocks, each block including a plurality of rows of cells. The circuit for performing operations on the non-volatile memory, may obtain a row identifier identifying a row of a target page, among the plurality of rows. The circuit may generate, by a machine learning model, one or more voltage thresholds for a read operation, based on the row identifier. The circuit may perform the read operation on the target page of the non-volatile memory with the one or more voltage thresholds.

20 Claims, 21 Drawing Sheets

SYSTEMS AND METHODS FOR HIGH PERFORMANCE READ WITH ROW-TO-ROW THRESHOLD TRACKING IN NVM

CROSS-REFERENCE TO RELATED APPLICATIONS

This application claims the benefit of and priority to U.S. Provisional Patent Application No. 63/695,132 filed on Sep. 16, 2024 and U.S. Provisional Patent Application No. 63/695,114 filed on Sep. 16, 2024, both of which are incorporated herein by reference in its entirety for all purposes.

TECHNICAL FIELD

The present arrangements relate generally to system and method for performing operations of a flash memory, and more particularly to system and method for dynamically adapting read thresholds based on per row optimal thresholds characterization.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired.

SUMMARY

The present arrangements relate to system and method for dynamically adapting read thresholds based on per row optimal thresholds characterization.

According to certain aspects, arrangements provide a method for performing operations on a non-volatile memory including one or more blocks, each block including a plurality of rows of cells. The method may include obtaining a row identifier identifying a row of a target page, among the plurality of rows. The method may include generating, by a machine learning model, one or more voltage thresholds for a read operation, based on the row identifier. The method may include performing the read operation on the target page of the non-volatile memory with the one or more voltage threshold.

According to other aspects, arrangements provide a flash memory system including a non-volatile memory and a circuit. The non-volatile memory may include one or more blocks, each block including a plurality of rows of cells. The circuit for performing operations on the non-volatile memory, may be configured to obtain a row identifier identifying a row of a target page, among the plurality of rows. The circuit may be configured to generate, by a machine learning model, one or more voltage thresholds for a read operation, based on the row identifier. The circuit may be configured to perform the read operation on the target page of the non-volatile memory with the one or more voltage thresholds.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein.

DETAILED DESCRIPTION

Figure 1:
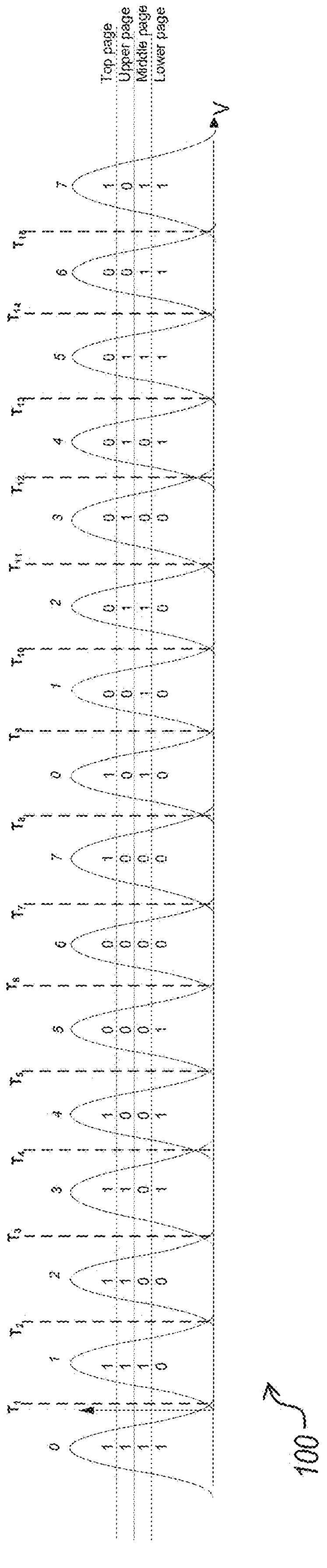
FIG. 1 illustrates an example of a voltage threshold distribution according to some arrangements.

According to certain aspects, arrangements in the present disclosure relate to techniques for dynamically adapting read thresholds based on per row optimal thresholds characterization.

In a conventional flash memory system (e.g., controller in NAND flash devices) may implement simplified read flows where fixed thresholds are used at start-of-life (SOL). These thresholds are called default thresholds, or first-phase-read thresholds, or normal read thresholds. In case of failure, a read retry may be performed with predetermined thresholds from a look-up table (LUT). If the retry succeeds, these thresholds can be used for all other reads from the same block. Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired. For example, in estimating the current thresholds for one or more rows, a conventional method of using thresholds that are estimated on a particular row (e.g., a target row) for all other rows in a block, may increase probability of failure.

To solve these problems, according to certain aspects, arrangements in the present disclosure relate to systems and methods for improving performance of read operations with row-to-row threshold tracking in a NAND flash memory. In some arrangements, systems and methods can achieve high read performance from NAND flash devices by dynamically adapting thresholds based on per row optimal thresholds characterization. In some implementations, a system (e.g., a NAND flash device) can include a thresholds predictor or estimator configured to predict thresholds. In some arrangements, the thresholds predictor can dynamically calculate, based on a current thresholds table and a target row (e.g., a target row to be read by a read command), optimal thresholds for each read command. The system according to some arrangements can achieve a minimal retry rate which can maximize a read throughput, with an efficient hardware implementation which can enable dynamic thresholds setting per read in real-time so that data can be continuously read in a streaming mode.

In some arrangements, the system can provide a pre-computed set of thresholds adapted per row. In some arrangements, the default thresholds can be replaced by per-row optimized thresholds. In case of failure, the system can perform a (read) retry with per-row adapted shift thresholds (e.g., thresholds shifted by a value adapted and/or optimized per row).

In some arrangements, the system can achieve high read performance due to reduced probability of read failure by adapting read thresholds for start-of-life (SOL) conditions, even before a first retry. In some arrangements, the system can achieve high read performance by a row-to-row (R2R) estimator which can be used during first-phase reads to replace the default reads (e.g., reads using default thresholds).

In some arrangements, the system can use optimized thresholds (e.g., per-row adapted shift thresholds) for read-retry, where a table of thresholds (e.g., LUT) can be used for stress adapted conditions, and per row thresholds can be computed per stress case. The system can calculate or compute per-row thresholds from a LUT per stress condition at SOL, and/or per retry stresses.

In some arrangements, the system can use a deep-neural-network (DNN) to compute or calculate per-row thresholds for each stress condition. LUTs can be trained on a database created per stress conditions, and/or optimized such that a read-retry rate (RRR) is minimized for a target flash device. Similarly, one or more DNN can be trained on a database created per stress conditions, and/or optimized such that an RRR is minimized for a target flash device. Here, an RRR refers to a rate of a retry that occurs when a decoder of data read from memory fails. In some arrangements, a retry method can be optimized for SOL where a combination of hard decoding and a single read are performed (rather than using a soft decoder that needs multiple reads).

In some arrangements, the system can use a history table (HT) per block to keep record of current thresholds indexes (e.g., an index of a threshold currently being used) in a compact manner. In some arrangements, the system can use a stress condition pointer (e.g., stress condition identifier or index) to select a LUT or a DNN for per row threshold computation.

In some arrangements, in performing an R2R estimation during SOL, the system does (e.g., R2R estimator) does not receive a stress condition as input. The R2R estimator can receive an index from a history table that corresponds to a stress condition, and according to the index and a target row, a machine-learning model (e.g., DNN or any neural network) can provide voltage thresholds for target page. In some arrangements, the system can use a shift index which may be a history table index and may be associated with a corresponding stress condition.

In some arrangements, the system can include or implement a single DNN configured to receive, as input, a stress conditions pointer and a target row. The DNN can compute, as output, target thresholds to be used for the target row under a current stress (corresponding to the stress conditions pointer). In some arrangements, the system can implement a generic DNN hardware block (e.g., circuit) configured to support high read performance and allow a real-time estimation of target page-read thresholds for every read operation. In some arrangements, such DNN hardware block can be replaced or combined with software, firmware or a combination thereof.

In some arrangements, the system implement a DNN engine in hardware. In some arrangements, a DNN or any machine learning model can implement an R2R estimation and read algorithm (referred to as "DNN-R2R") by using an entity embedding representation to represent a row index. In some arrangements, the system select a reference row from among a plurality of rows and estimate per-row thresholds based on the reference row. In some arrangements, the DNN or any machine learning model can be trained to perform the DNN-R2R of SOL for every retry.

According to certain aspects, arrangements in the present disclosure relate to a method for performing operations on a non-volatile memory including one or more blocks, each block including a plurality of rows of cells. The method may include obtaining a row identifier identifying a row of a target page, among the plurality of rows. The method may include generating, by a machine learning model, one or more voltage thresholds for a read operation, based on the row identifier. The method may include performing the read operation on the target page of the non-volatile memory with the one or more voltage thresholds.

According to certain aspects, arrangements in the present disclosure relate to a flash memory system including a non-volatile memory and a circuit. The non-volatile memory may include one or more blocks, each block including a plurality of rows of cells. The circuit for performing operations on the non-volatile memory, may be configured to obtain a row identifier identifying a row of a target page, among the plurality of rows. The circuit may be configured to generate, by a machine learning model, one or more voltage thresholds for a read operation, based on the row identifier. The circuit may be configured to perform the read operation on the target page of the non-volatile memory with the one or more voltage thresholds.

Arrangements in the present disclosure have at least the following advantages and benefits. First, arrangements in the present disclosure can provide improved or increased read performance with a reduced probability of read failure by adapting read thresholds for start-of-life (SOL) conditions, even before first retry. The read thresholds can be adapted by a row-to-row estimator which is used during first-phase reads to replace the default reads.

Second, arrangements in the present disclosure can provide optimized thresholds for read-retry by using a table of thresholds for stress adapted conditions, and computing per-row thresholds per each stress case (1) from a LUT per stress condition SOL, and/or per retry stresses and/or (2) using a DNN to compute. LUT or DNN can be trained on a database created per stress conditions, and can be optimized such that read-retry rate (RRR) is minimized for the target flash device.

Third, arrangements in the present disclosure can provide systems and methods for efficient, real-time estimation of thresholds using stress condition pointers or shift indexes. In some arrangements, a history table (HT) is used per block to keep record of current thresholds index in a compact manner. The system can use a stress condition pointer or a shift index, which is an index to the history table, to select LUT or DNN for per row threshold computation. In some arrangements, a single DNN can receive, as input, a stress conditions pointer and a target row and compute, as output, the target thresholds to be used for target row, under current stress.

Referring to FIGS. 1-20, arrangements of systems and methods for the present solution to dynamically adapt read thresholds based on per row optimal thresholds characterization are described and illustrated.

FIG. 1 illustrates an example of a voltage threshold distribution 100 according to some arrangements. FIG. 1 illustrates a voltage threshold distribution of a 4 bits per cell (bpc) flash memory device, i.e., quadruple level cells (QLC) with 16 programmable states. The voltage threshold (VT) distribution includes 16 lobes. A lower page read requires using thresholds T1, T3, T6 and T12. For reading the middle page, the read thresholds T2, T8, T11 and T13 are used. For reading the upper page, the read thresholds T4, T10 and T14 are used. For reading the top page, thresholds T5, T7, T9 and T15 are used. The lower most lobe (0) is known as the erase level. Retention, program/erase cycles and read disturb can change the voltage threshold distribution (E.g., voltage threshold distribution shown in FIG. 1) in different ways and create various bit error rate (BER) conditions. For each condition, different read thresholds can be chosen for achieving lowest BER after READ operation. Thus, the read thresholds of a target page in a NAND device are estimated repeatedly during the device life cycle in order to maintain high read performance and benefit from an efficient read flow with low latency that avoids SB decoding (soft-bit decoding) as much as possible.

Figure 2:
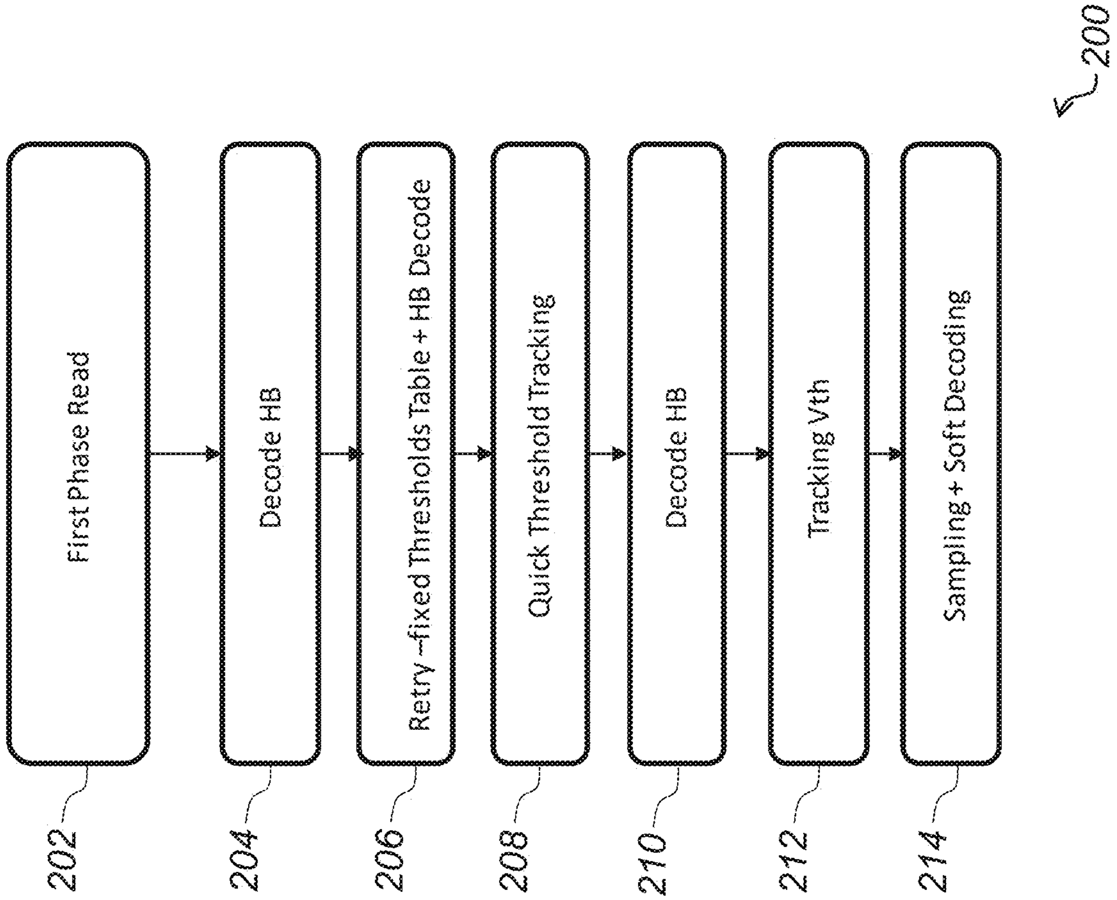
FIG. 2 illustrates an example process of read flow in a conventional flash device.

FIG. 2 illustrates an example (simplified) process 100 of read flow in a conventional flash device. FIG. 2 describes typical stages for read-retry in case of failures. On default, a flash memory system (e.g., controllers of a NAND flash device) may perform first-phase reads, which refers to reads with pre-configured (or pre-defined) initial default thresholds (step 202). The system (e.g., a controller of a NAND flash device) may decode a read by a hard-bit (HB) decoder, e.g., a decoder that operates on binary input (step 204). In case of a decode failure, the controller may refer to a shift table that holds several thresholds candidates. The candidate thresholds are also referred to as a "retry-fixed thresholds table". On a first (read) failure on a page, the controller may choose or select a first table entry, configure the NAND thresholds based on the first entry, read the same page again, and perform HB decoding (step 206). In case of a second failure, the process may be repeated with other shift table candidates until success on HB decoding. On a HB decode success, the shift table entry (e.g., a threshold candidate used for the read corresponding to the HB decode success) may be saved in a table called history table (HT) that is available per block. A pointer to the HT may be used for future reoccurring reads from same block, to allow the controller to use the same thresholds that are compatible to a current stress of this block. If decoding fails with all shift table candidates, then the controller may perform a quick threshold tracking (QT) to estimate the optimal thresholds of the current row (step 208). The QT may perform a few mock reads with fixed thresholds, from which a histogram is computed. An estimator (e.g., controller, or software, firmware, hardware, or a combination thereof) may use the histogram for estimating the current thresholds. The estimator can be a linear estimator or a DNN based estimator. The controller may configure estimated thresholds to NAND, and perform a read-retry, followed by HB decoding (step 210). If HB decoding fails, then the controller may perform a higher complexity threshold tracking (step 212), e.g. pre-soft tracking (PST), followed by sampling and/or soft decoding (step 214).

In some arrangements of the present disclosure, a system (e.g., a NAND flash device or a controller thereof) can perform a row-to-row (R2R) estimation. According to the physical characteristics of the NAND, there is a typical voltage-threshold (VT) probability distribution for every NAND row per block. On 3D-NANDs there may be a typical distribution per word-line (WL), where rows within a given WL may have a similar VT distribution (referred to as a row-VT distribution). Therefore, if thresholds are known for a target row as a result of activating an estimation process on that row, then it might be useful to use this result and estimate thresholds of any other row, from a given row (e.g., the target row) and thresholds of the given row, by using the typical row-VT distribution, thereby saving the cost and/or overhead of thresholds-estimation per row.

According to some arrangements of the present disclosure, a row-to-row (R2R) estimator can be trained in order to provide a minimized retry probability, when a controller performs first-phase reads. The R2R estimator can receive as input a target row, and provide optimal shifts (e.g., optimal in terms of reducing a retry probability) to apply with respect to a first-phase read shift. In some arrangements, the first-phase read shift may be zero shifts of default thresholds. The R2R estimator can be implemented in various manners including (1) a look-up-table (LUT), which provides the shifts per threshold and per row; (2) a linear based estimator; and/or (3) a DNN based estimator. In some arrangements, a LUT-based R2R estimator for first-phase reads may be fully optimized to support all required stresses to provide lowest RRR with first-phase-reads using a LUT (e.g., a LUT which provides the shifts per threshold and per row). As a NAND density increases, the blocks may become larger, due to having more layers and strings per block. The advantage of using a DNN-based R2R estimator is relatively smaller memory requirements for such large blocks. Thus, a DNN-based R2R estimator can perform effectively a compression of a LUT. Such DNN-based compression is also scalable to future NAND devices.

In some arrangements, an R2R estimator can be trained for a fixed thresholds set, which are used within a read retry flow (or a read retry process/operation). That is, the R2R estimator can have a specific trained configuration for every entry of a retry-fixed thresholds table, where each entry represents another subset of stress conditions that are supported by the controller. For example, in case of data-retention (DR) stress, thresholds can be optimized over a specific row that is referred to as "reference row". A table (e.g., LUT for R2R) can be optimized on this stress as well, to convert the reference row thresholds to every other row under this DR stress.

In some arrangements, the R2R estimator can be described as:

$$TH_{r2r}(\text{row}, ShiftIdx) = TH_{ref}(ShiftIdx) + LUT_{ShiftIdx}(\text{row}) \quad \text{(Equation 1)}$$

For every shift index, a LUT can be defined per row to provide target thresholds. A shift index may be a retry-fixed thresholds table index which is an index to a retry-fixed thresholds table. An "index" or "shift index" refers to a retry pointer that is saved per block. The retry pointer can be associated with a stress condition. Holding a LUT per shift-index means that there is a different R2R estimator per read-retry. The row index can be an entry pointer to the LUT. This can adapt the R2R estimation according to a stress condition. In some arrangements, first-phase reads may correspond to ShiftIdx=0. This LUT-based implementation may be memory inefficient. In a LUT implementation, a suboptimal solution which saves memory can use a common LUT for all shift indexes, as follows:

$$TH_{r2r}(\text{row}, ShiftIdx) = TH_{ref}(ShiftIdx) + LUT(\text{row}) \quad \text{(Equation 2)}$$

where an identical LUT can be used for all shift indices. The LUT can also be the same table for the case of read after quick threshold tracking (QT). The reference thresholds in the case of read after QT may be mapped from a failed row to a (common) reference row using the LUT, and then the thresholds value may be compressed by clustering to the nearest cluster (e.g., using K-means clustering), and only the index cluster center can be be saved as the ShiftIdx. This compression can significantly reduce the memory requirements per threshold tracking operation, allow for using a compact history table (HT) to save the state of a block after failure, and/or allow near optimal thresholds for all rows using the R2R estimator with the mapped ShiftIdx after QT.

In some arrangements, the R2R estimator can be implemented by a DNN, which may receive the ShiftIdx as an input feature, together with a row index (e.g., row index of a target row), and provide the thresholds to be used for read of the target row. The ShiftIdx can be available from the history table per block.

$$TH_{r2r}(\text{row}) = DNN(ShiftIdx, \text{row}) \quad \text{(Equation 3)}$$

Figure 3:
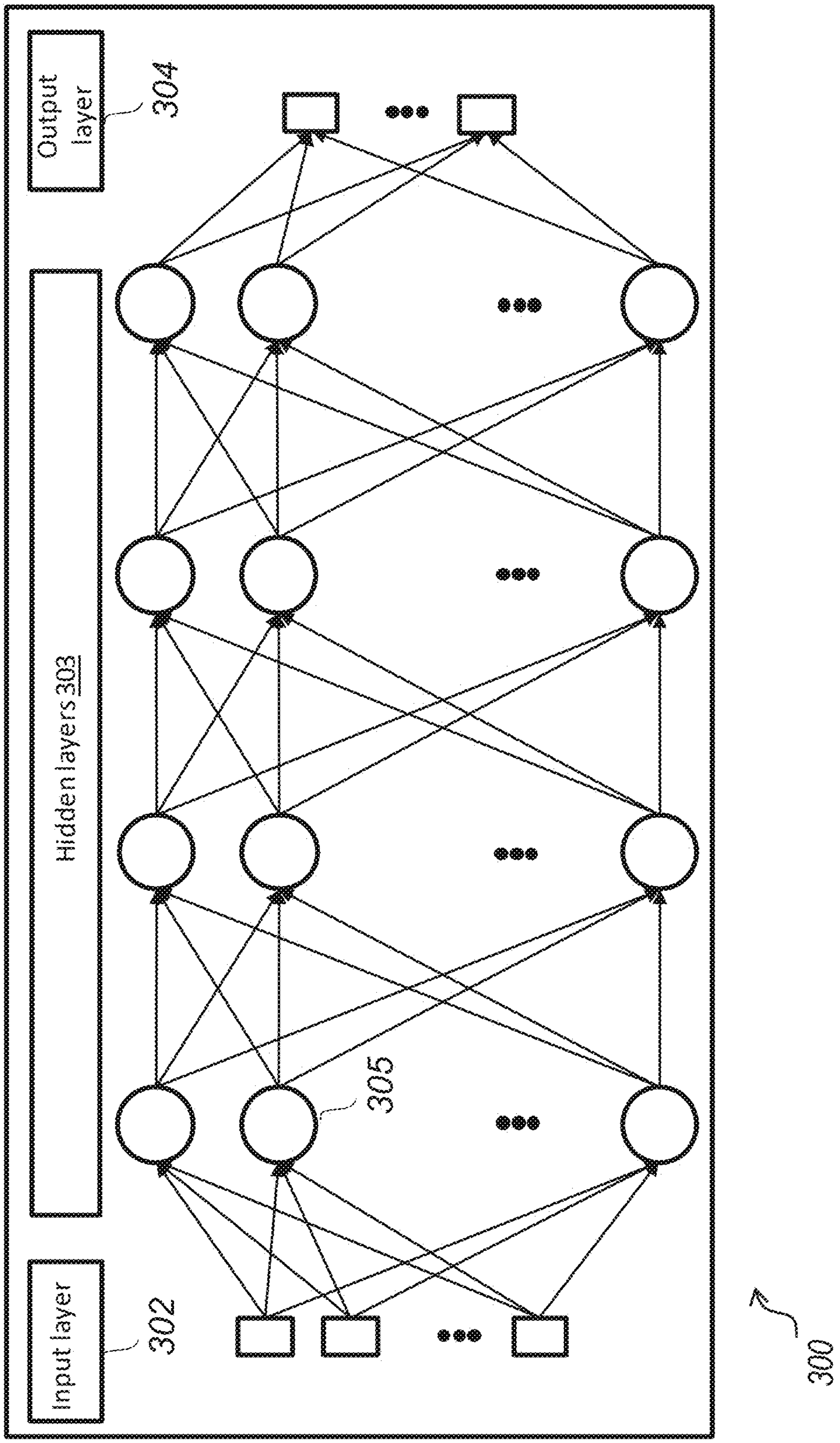
FIG. 3 illustrates an example of a fully-connected (FC) deep neural network (DNN) for a row-to-row (R2R) estimator according to some arrangements.

FIG. 3 illustrates an example of a fully-connected (FC) deep neural network (DNN) 300 for a row-to-row (R2R) estimator according to some arrangements. The example DNN may include an input layer 302, one or more hidden layers 303, and/or an output layer 304. In the example DNN shown in FIG. 3, the input layer 302 can include a target row index (e.g., index to a target row) and a shift index. The output layer 304 can include an estimated thresholds for the target row.

In some arrangements of the present disclosure, a row index can be represented by entity embedding (EE) which is a result of a 1-hot input training for a DNN estimator (e.g., DNN-based R2R estimator). In some arrangements, entity embedding for the row index can be implemented or obtained by training a 1-hot input of row index that is fully connected to a few neurons of a DNN (e.g., neurons 305). The entity embedding values per row can be saved in a LUT which is used as input instead of a 1-hot input. For example, the LUT can map a row index to values of neurons that are connected to the original 1-hot input. The LUT can be used to provide the neuron values per row index instead of the 1-hot input and the neuron's fully connect weights. This can save a lot of memory, and can reduce implementation complexity. This LUT-based implementation of the entity embedding (EE) is very robust for large NAND blocks with many rows. Since the entity embedding (EE) implementation saves memory and reduces implementation complexity, the EE can be used for large NAND blocks. The EE can be an alternative form for implementing row index encoding to neuron values.

In some arrangements, a DNN (or a DNN-based R2R estimator) can be trained with input thresholds which correspond to (1) optimal thresholds of a selected reference row, or (2) QT thresholds of the selected reference row. In some arrangements, the R2R thresholds obtained by the DNN-based R2R estimator can be given by $$TH_{r2r}(row) = DNN(ShiftIdx, \text{row}, TH_{HT-ref}) \quad \text{(Equation 4)}$$

where the ShiftIdx (shift index) can be a pointer to the phase/retry stages of the history table. The shift index can correspond to the number of retry or the current stress condition (e.g., retry index). This retry index can be a subset of a history table (HT). The HT can be a generalized form of saving thresholds per block corresponding to different stress conditions. The ShiftIdx can be a pointer to the generalized HT. Initial few entries (e.g., low index values) of the HT can correspond to a few ordered start-of-life (SOL) set of stresses, hence the shift-index can be used as input to the DNN. The $TH_{HT\text{-}ref}$ input can correspond to the thresholds extracted from the history table, in case that QT is activated on this block. The $TH_{HT\text{-}ref}$ input can be reference thresholds from HT that are closest to the estimated thresholds by a QT operation while $TH_{HT\text{-}ref}$ is read-flow dependent.

Figure 4:
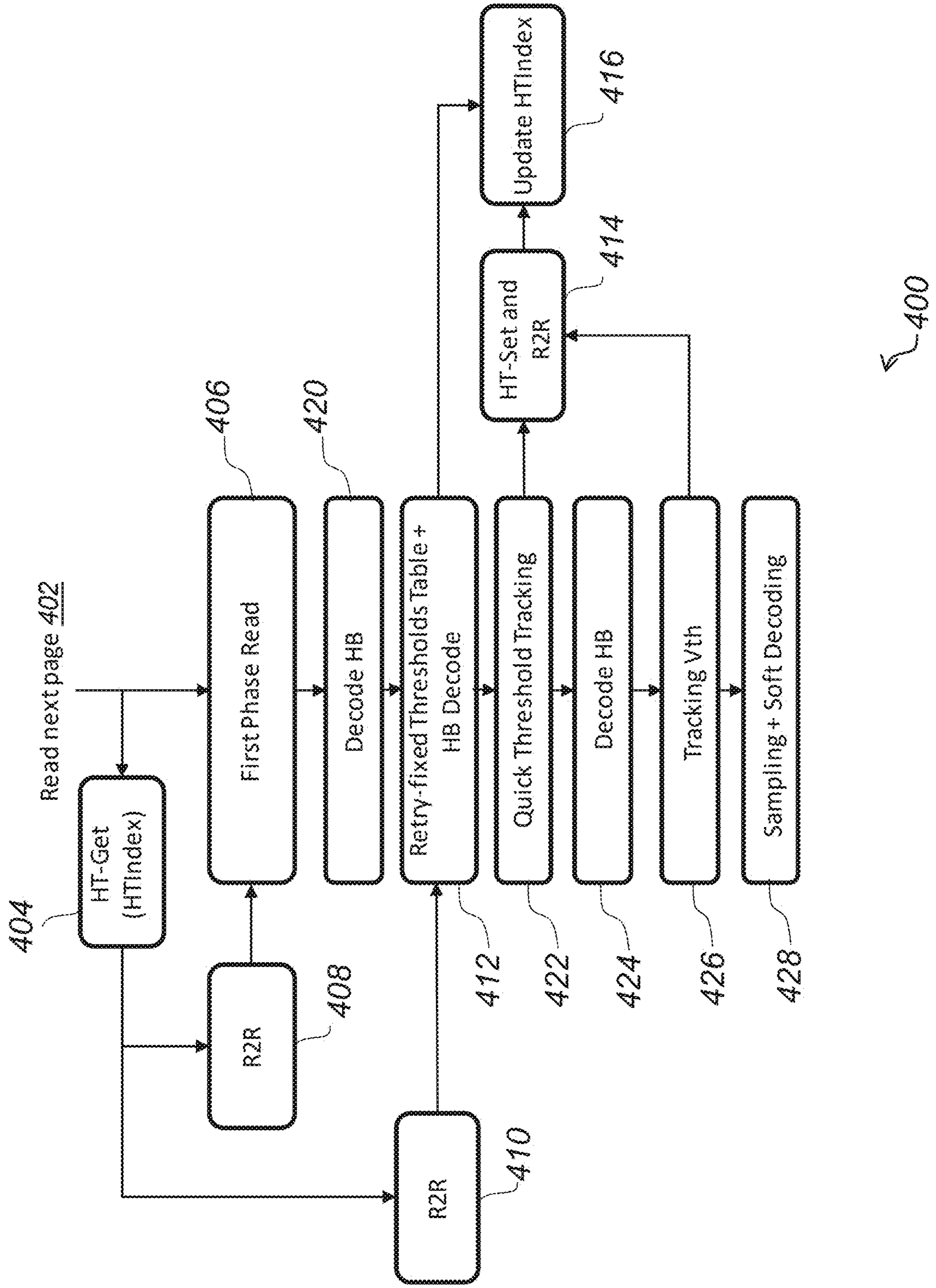
FIG. 4 illustrates an example of read flow that employs an R2R estimator for all stages in the read flow according to some arrangements.

FIG. 4 illustrates an example process 400 of read flow that employs an R2R estimator for all stages in the read flow according to some arrangements. FIG. 4 demonstrates a read-flow which employs a R2R transformation on input thresholds, according to a read stage. The R2R thresholds can be taken or obtained from a R2R estimator according to some arrangements of the present disclosure.

The read flow shown in FIG. 4 includes receiving and/or executing a read command to a target page (step 402). A history table (HT)-Get operation can extract a HTIndex (e.g., index to a history table) that keeps the state of the block and points to the type of read on a first stage (e.g., first phase read) (step 404). For example, if HTIndex is equal to 0, then first-phase reads can be performed with read thresholds according to a row of a target page (step 406). For example, when using a DNN-based R2R estimator (step 408), for HTIndex=0, the read thresholds can be DNN(0, row) (see Equation 3) which corresponds to a DNN output. If HTIndex has another value that is up to (or less than or equal to) the number of entries in retry-fixed thresholds table (step 410), then DNN(HTIndex,row) (see Equation 3) can be used to provide the read thresholds (step 412). If (or only if) HTIndex is higher than the number of retry-fixed thresholds-table entries, then HTIndex can refer to a codebook that provides the corresponding thresholds, which are extracted from a LUT. The LUT is a codebook such that the input of the LUT is the HTindex (same as shiftIdx), and the output of the LUT are thresholds for reference row ($TH_{HT\text{-}ref}$). An R2R estimator can provide the target row thresholds using DNN(ShiftIdx,row,$TH_{HT\text{-}ref}$) (see Equation 4). Steps 420, 422, 424, 426, 428 can be similar to steps 204, 208, 219, 212, 214 as shown in FIG. 2, respectively. After performing quick threshold tracking (QT), an HTIndex can be computed using the HT-Set operation (step 414), which can be implemented by a K-means search algorithm, and the HTIndex can be updated (step 416).

For the read-flow shown in FIG. 4, the R2R estimator can be either an identical estimator for all HT indices by providing as input the thresholds for each of the stages. Alternatively, the R2R estimator can be optimized per HTIndex separately. The implementation type may depend on implementation complexity limitations, and estimation-accuracy tradeoffs.

Figure 5:
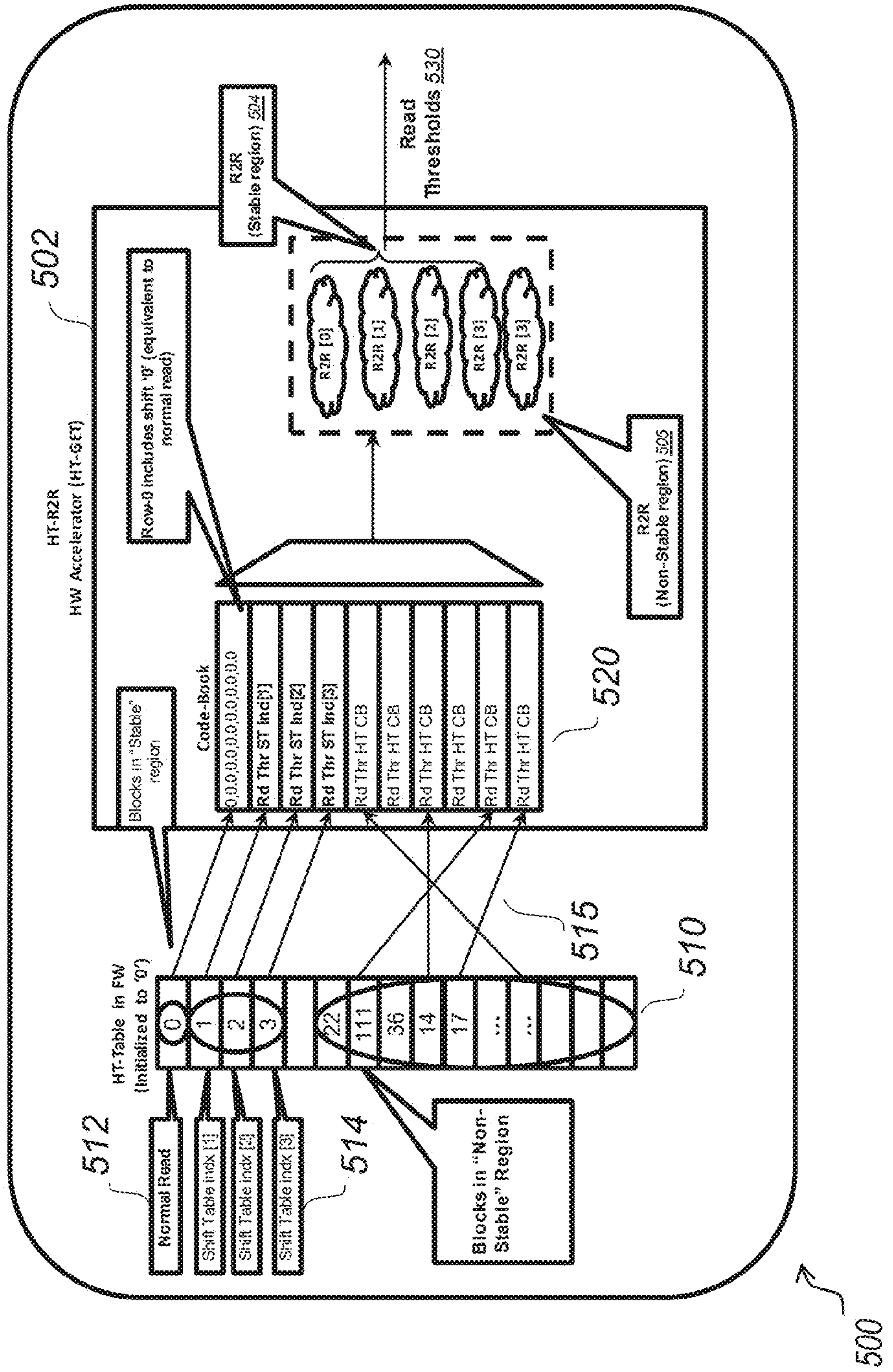
FIG. 5 is an example system implementing an R2R estimator and a history table (HT)-Get operation, with separate R2R estimators for each retry stage, according to some arrangements.

FIG. 5 is an example system 500 implementing an R2R estimator and a history table (HT)-Get operation 502, with separate R2R estimators for each retry stage 504, 505, according to some arrangements. FIG. 5 demonstrates an implementation of the read flow of FIG. 4, which employs a R2R transformation on input thresholds according to a read stage. The R2R thresholds 530 can be obtained or taken from a R2R estimator according to some arrangements of the present disclosure. The HT-Get operation 502 can extracts (from a HT table 510) a HTIndex that keeps the state of the block, and points to the type of read on a first stage. For example, if HTIndex==0, then first-phase reads 512 can be performed with thresholds according to row of target page. For example, for HTIndex=0, then the R2R[0] estimator can be used. If HTIndex has another value that is up to (or less than or equal to) the number of entries in a retry-fixed thresholds-table (e.g., the number of entries is 3), then one of the R2R[1] estimator, the R2R[2] estimator, or the R2R[3] estimator can be used according to HTIndex. If HTIndex>3, then HTIndex refers to a codebook (CB) 520 that provides the corresponding thresholds, which are extracted from the LUT, and a R2R estimator can provide the target row thresholds using R2R[HTIndex]. This LUT can be a codebook 520 such that the input of the LUT is the HTindex (same as shiftIdx 515), and the output of the LUT are thresholds for reference row ($TH_{HT\text{-}ref}$).

Figure 6:
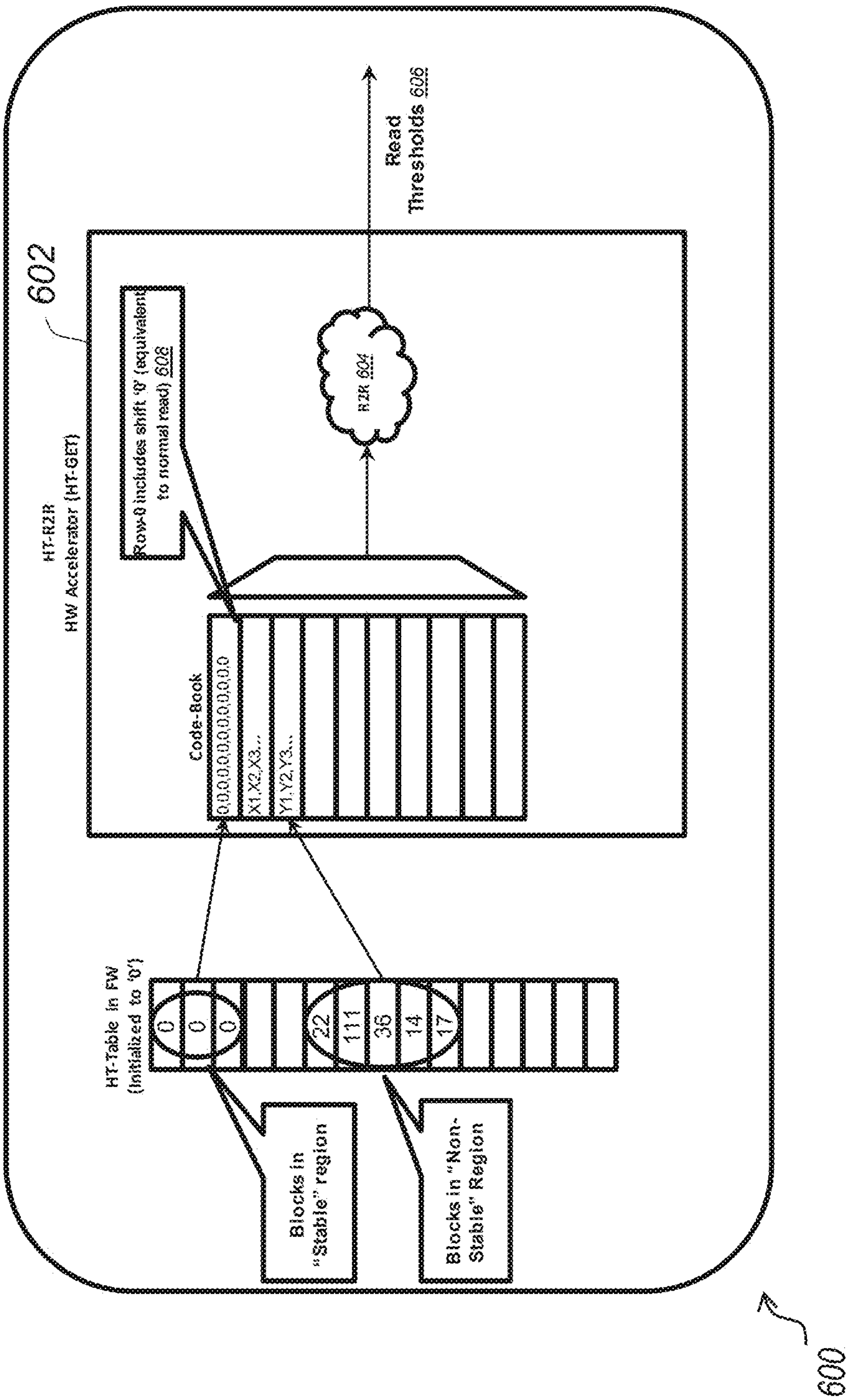
FIG. 6 is a an example system implementing an R2R estimator and a HT-Get operation, with a common R2R estimator for all HT-Get indices, according to some arrangements.

FIG. 6 is a an example system 600 implementing an R2R estimator and a HT-Get operation 602, with a common R2R estimator 604 for all HT-Get indices, according to some arrangements. FIG. 6 demonstrates an implementation of the read-flow of FIG. 4, which employs a common R2R transformation on input thresholds, according to HTIndex and corresponding input thresholds. The R2R thresholds 606 can be obtained or taken from a R2R estimator according to arrangements of the present disclosure. The HT-Get operation can extracts the HTIndex that keeps the state of the block, and points to the type of read on a first stage. For example, if HTIndex is equal to 0, then first-phase reads 608 can be performed with thresholds according to a row of a target page (e.g., target row). For example, a R2R estimator can receive as input (1) the target row and (2) the default thresholds of the reference row, and provide as output target row estimated thresholds 606. Using a common R2R estimator for all HTIndex values can have a lower memory requirement compared to separate R2R estimator per retry-fixed thresholds-table entry.

In some arrangements of the present disclosure, a system (e.g., a NAND flash device or any computing device) can perform training of a R2R estimator. In some arrangements, the R2R estimator can be trained on a voltage-thresholds scan (VT-scan) which provides a VT probability distribution, for various stress conditions, which are within the supported stresses of a NAND device (e.g., a subset of the supported stresses of the NAND device). In some arrangements, a database can include or store characterization of VT distributions per row of multiple representative devices for each stress condition. The stress condition may include start-of-life (SOL) conditions, moderate stresses and/or end-of-life (EOL) stress conditions. In some arrangements, the database can be used for offline characterization of the typical thresholds per row.

In some arrangements, the training of the R2R estimator may include a (first) step of determining a reference row such that the reference row is the most stable row among a plurality of rows and therefore, from the reference row it is possible to estimate target row thresholds of any other row at highest accuracy. One possible method of determining the reference row can include (1) computing optimal thresholds of all rows in the database; and then (2) choosing or selecting a row with lowest variance score according to following steps S1 to S6.

In step S1, for a given row-hypothesis (or a given row of a plurality of rows), a system (e.g., controller of a NAND flash device or a computing device) can compute a distance between an optimal threshold of the given row in a block to all other rows in the same block. Here, the optimal threshold can be optimal in terms of a minimum number of read errors. In step S2, the system can repeat step S1 for all blocks in a database. In step S3, the system can compute a variance of optimal thresholds distance (as computed in step S1) for every row pair across the database. In step S4, the system can compute, as an average variance score of the given row, an average variance of the variances for all row-pairs (as computed in step S3). In step S5, the system can repeat steps S1-S4 for all row-hypotheses to compute average variance scores of respective rows. In step S6, the system can choose or select, as a reference row, a row with a smallest average variance score among the all row-hypotheses. In this manner, the chosen row can have lowest noise, and can be used for most accurate estimation of other rows' thresholds.

In some arrangements, another method for estimation of a reference row can be defining for every row-hypothesis a LUT by computation of a weighted average distance of a target row for hypothesis row over all appearances in a database. For example, the LUT created here can be a R2R LUT that transforms a row index from a given reference row. The reference row may be a hypothesis. After evaluation of all hypotheses, the selected reference row can be the one that contributes lowest add-BER tail (or total BER). The method for computation can be performed from a given database. The LUT can contain a weighted distance from a hypothesis reference row to a target row. The weighted distance can be calculated using the following equation.

$$\text{Distance(row to } hypoRow) = \text{Average}(w*(optTH(\text{row}) - refTH)), \quad \text{(Equation 5)}$$

where optTH(row) are the given optimal thresholds for row per block in the database, and w is a weight which can be total BER (or any power of the total BER, etc.) with the optimal threshold.

refTH is the reference thresholds of a hypothesis row, and can be computed as follows:

$$refTH = \text{Average}(w*optTH(hypoRow)) \quad \text{(Equation 6)}$$

The weighted average may use total BER with optimal thresholds for every row. Such weighting can provide a higher weight on the rows with higher BER, and may assist in reducing added-BER tail for a R2R initial estimator The R2R initial estimator is an estimator for R2R that does not require a DNN training. The R2R initial estimator can be very computationally efficient, however may not be too accurate. This is why it is called an initial estimator.

In yet another method for estimation of a reference row, higher orders of moments may also be used. Higher order of moments may also assist in reducing added-BER tail. The system calculate higher orders of moments for every row-hypothesis, and then select, as a reference row, a row that provides highest estimation accuracy. Estimation accuracy can be measured by added BER, e.g., average added BER or added BER tail at low probabilities, which can be computed from the add-BER CCDF. In another arrangement, estimation accuracy can be measured by total BER, instead of added BER.

In some arrangements, once the reference row is determined, the system can perform a more detailed training on a R2R estimator. According to some arrangements of the present disclosure, a R2R estimator for SOL can be trained for first-phase reads. A database for first-phase reads can be defined by all expected SOL stresses that may support successful HB decoding with low RRR when reading with (1) thresholds estimated by the R2R estimator and (2) default thresholds. This database can be used for training a LUT estimator or a DNN(0,targetRow) estimator (see Equation 3). Similarly, for every shift index, a subset database can be used to train a retry-fixed thresholds-table entry specific estimator. Additionally, a common DNN estimator can be trained such that input features include the shift index corresponding to every stress subset, thereby providing a lower complexity estimator.

Figure 7B:
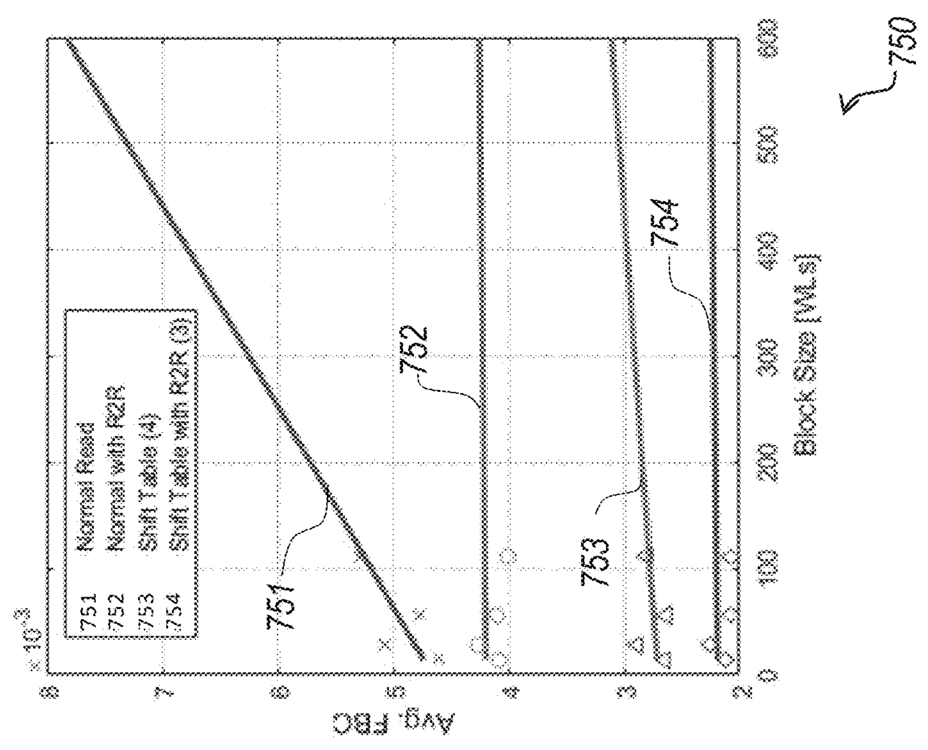
FIG. 7A and FIG. 7B illustrate diagrams illustrating an example result of standard deviation (STD) of fail bit counts (FBC) and average FBC as a function of number of word lines (WLs) with and without an R2R estimator, according to some arrangements.
Figure 7A:
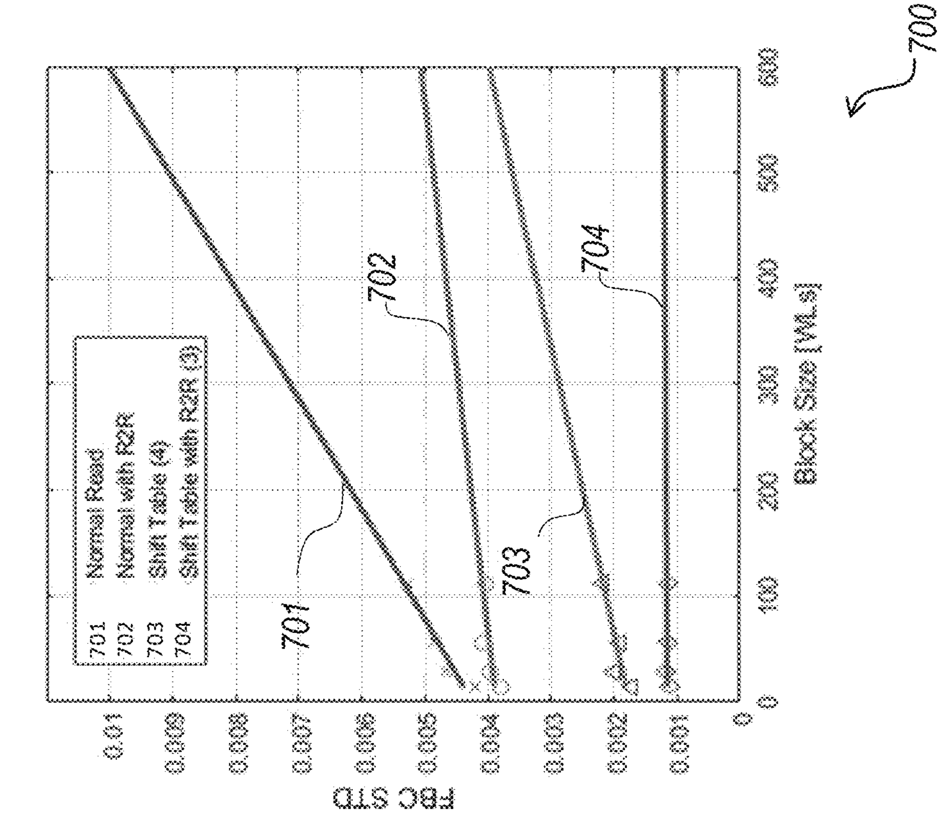

FIG. 7A and FIG. 7B illustrate diagrams 700, 705 illustrating an example result of standard deviation (STD) of fail bit counts (FBC) and average FBC as a function of number of word lines (WLs) with and without an R2R estimator, according to some arrangements.

FIG. 7A and FIG. 7B demonstrate the average BER (FIG. 7A) and STD BER (FIG. 7B) as a function of the number of WLs when reading uses default thresholds on a subset of stresses that supports first-phase read. Curves 701, 751 indicate an evaluation result when using default thresholds, as compared to default thresholds with R2R according to some arrangements (as indicated by curves 702, 752). The number of WLs was evaluated by taking an existing large database, and computing average/STD for subset of rows corresponding to number of WLs for same database. As may be observed, when using R2R jointly with default thresholds, the BER increases at a much slower slope as function of number of WLs. This clearly suggests that using R2R with default thresholds guarantees a scalable solution for advanced NAND devices with more and more WLs, which are a result of additional layers in 3D-NANDs. Same typical behavior is observed with retry-fixed thresholds-table fixed thresholds (as indicated by curves 703, 753), as compared to retry-fixed thresholds-table thresholds with R2R (as indicated by curves 704, 754) which have a much lower slope for BER increase as function of WLs.

Figure 8:
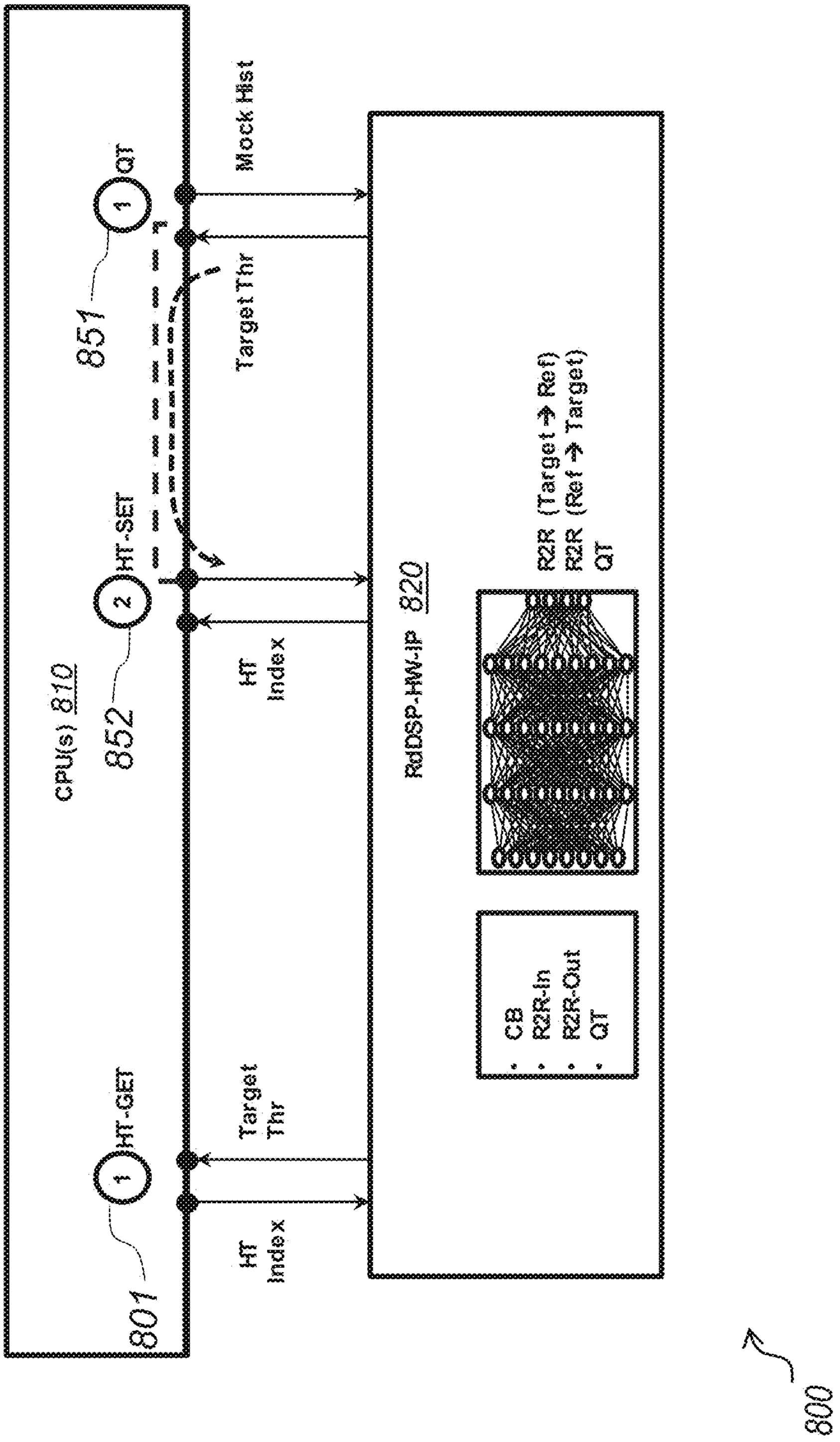
FIG. 8 illustrates a block diagram of an example hardware implementation for a configurable DNN estimator for R2R operations or quick threshold tracking (QT) operations, according to some arrangements.

FIG. 8 illustrates a block diagram of an example hardware implementation for a configurable DNN estimator 800 for R2R operations or quick threshold tracking (QT) operations, according to some arrangements. In FIG. 8, a CPU (central processing unit) 810 may control a hardware configuration and activation (e.g., RdDSP HW engine 820). In some arrangements, some hardware sequences can drive the RdDSP HW engine. In this manner, the same hardware can be used for various operations. For example, during first-phase reads 801, an R2R estimator can be configured for HT-get operations, with corresponding R2R estimator parameters. The same hardware 820 can operate in a streaming mode, and thus can be a part of any NAND controller's data path. During a retry that requires activation of QT 851, the CPU can configure the same hardware 820 to estimate the thresholds, from mock read histograms. Such utilization of a common hard block is possible since during retry of QT the controllers (e.g., controllers of a NAND flash device) flushes all other read commands, and read starts again in a streaming mode after thresholds are estimated on QT. After QT, the hardware (e.g., the common hardware block) can perform computation of an HTIndex using the HT-Set operation 852, which can be implemented by a K-means search algorithm in hardware (after a R2R conversion from a target row to a reference row). In some arrangements, the common hardware block can be replaced or combined with software, firmware or a combination thereof. The HT index can be stored for the reference row. Other types of retry such as a shift table can be supported similarly, and can even be more efficient when using a common R2R estimator for all HT-indices. The set of figures below (e.g., FIG. 9 to FIG. 17) describe more details of the HW block described above.

Figure 9:
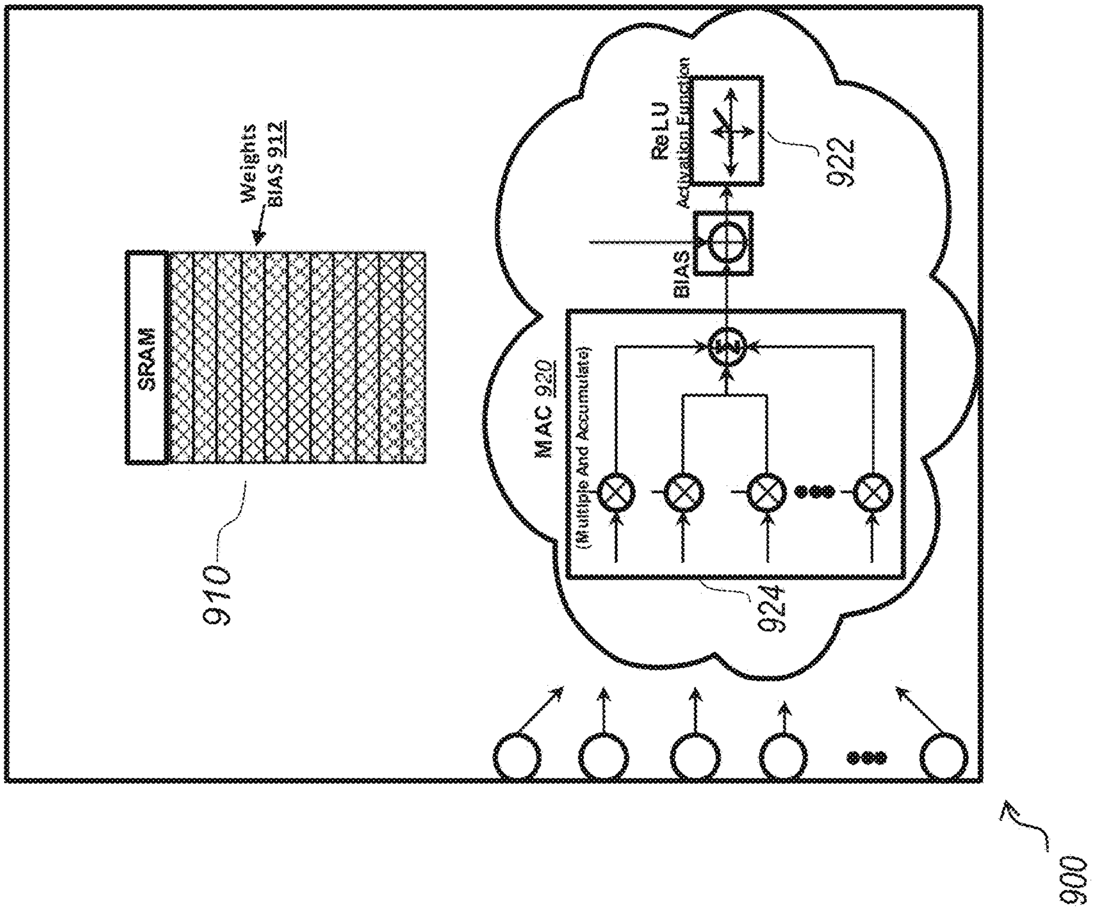
FIG. 9 illustrates a block diagram of an example hardware implementation of a DNN for a read system (e.g., read digital signal processing (DSP) system) according to some arrangements.

FIG. 9 illustrates a block diagram of an example hardware implementation of a DNN (e.g., DNN-based R2R estimator 900) for a read system (e.g., read digital signal processing (DSP) system) according to some arrangements. FIG. 9 shows a DNN estimator unit 900 which is configurable by CPU. The CPU can write to a register file in a hardware block (e.g., RdDSP-HW-IP shown in FIG. 8), and configure pointers for DNN coefficients in an internal RAM 910 (random access memory, e.g., SRAM). In some arrangements, the hardware block can be replaced or combined with software, firmware or a combination thereof. Weights and biases 912 that are stored in the RAM may be used for different DNNs, e.g., DNNs for QT or R2R. For different DNNs, different coefficients and different architectures can be used. For example, the number of layers and number of neurons per layer may be different for various estimation tasks. FIG. 9 shows a basic computational unit that implements a ReLU neuron computation 922 from a set of inputs multiplied by the corresponding values 924. The DNN hardware engine can include multiple configurable multiply-accumulate (MAC) modules 920. The DNN hardware engine can use the MAC modules in parallel and/or according to a network configuration. The DNN hardware engine can be configured for read operations which are performed in a streaming mode, which means that a maximal read throughput can attained. The DNN hardware engine can perform operations like HT-Get and R2R per read command within the data-path to provide optimized thresholds per page-read (e.g., optimized thresholds in terms of reducing the number of retries). The HT-Get operation can use the HT-index to determine whether the reference row thresholds are default thresholds or retry-fixed thresholds-reads, or even post-QT thresholds. Per read command, reference-row thresholds in the target block can be extracted during HT-Get, and then the R2R estimator can be used to compute the page specific thresholds, which can be provided to the NAND read command in real-time.

Figure 10:
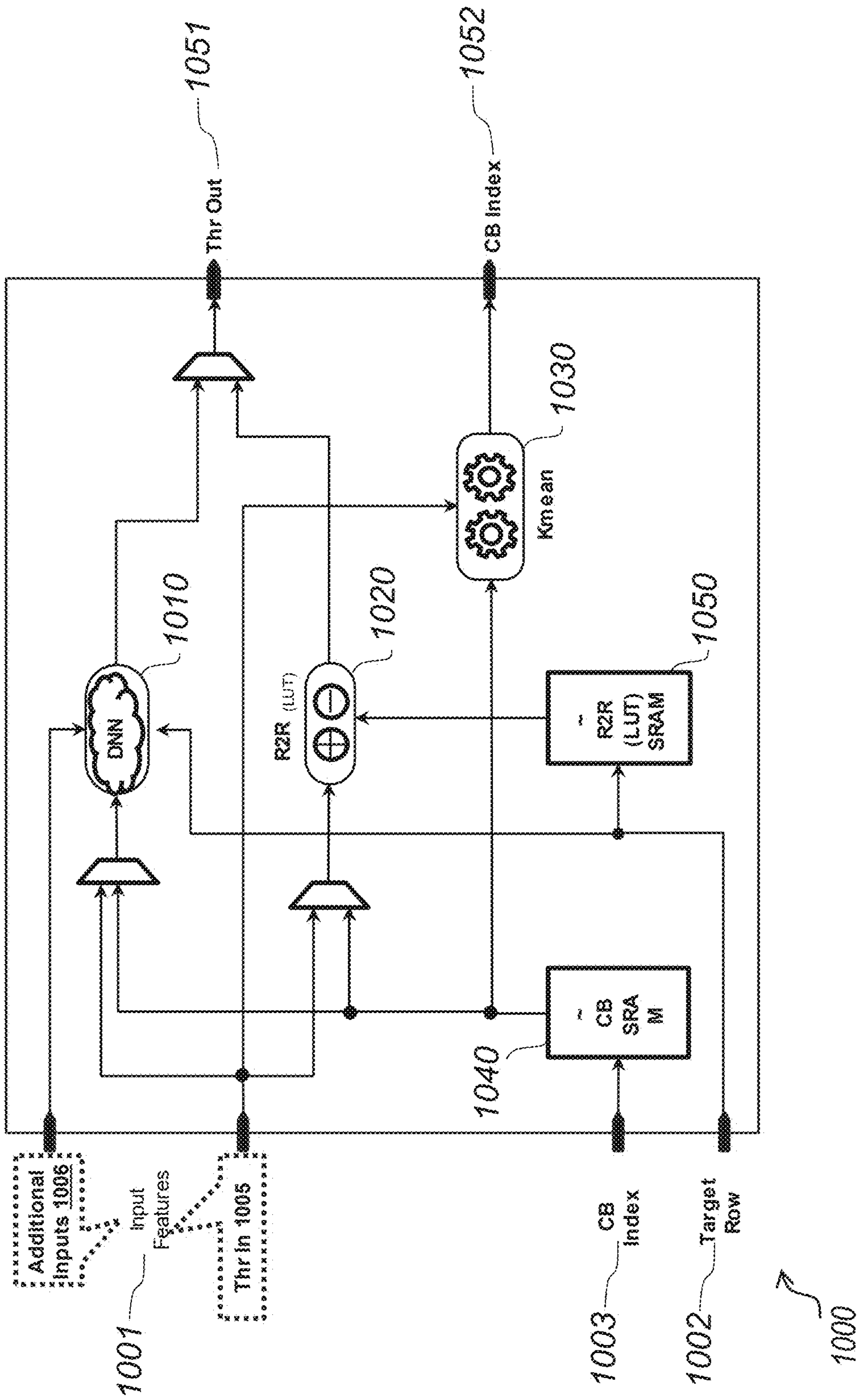
FIG. 10 is a diagram illustrating an example hardware architecture for R2R estimators, HT, and a DNN, according to some arrangements.

FIG. 10 is a diagram illustrating an example hardware architecture (or engine) 1000 for R2R estimators, HT, and a DNN, according to some arrangements. FIG. 10 depicts a general architecture of a hardware block. The hardware block may include engines (e.g., one or more circuits or processors) for DNN 1010, R2R (estimator) 1020, or K-means search 1030. In some arrangements, such hardware block can be replaced or combined with software, firmware or a combination thereof. The hardware block also can include databases (e.g., one or more memories or storages 1040, 1050) for a codebook and/or R2R estimation which can be offline calculated and can be one-time initialized after power-up.

In some arrangements, inputs to the hardware block may include (1) input features 1001, (2) a target row 1002, and/or (3) CB (codebook) index 1003 for use by a DNN 1010 and/or a R2R estimator 1020. The input features may include thresholds—In 1005 which may be used as input for a DNN 1010 when used, or used as input for a R2R estimator 1020 when used, or used as input for a K-means search 1030 when used. The input features may include additional inputs 1006 such as a set of rows, a cycle range, temperature(s) at programing and/or reading, etc. In some arrangements, outputs of the hardware block may include (1) estimated read thresholds 1007, and/or (2) CB index 1008 (e.g., CB index as output of a K-means search).

FIG. 11 to FIG. 17 demonstrate several different flows usage with a hardware block. In each figure, the active input, engines, and/or outputs are highlighted in bold faces and thick lines.

Figure 11:
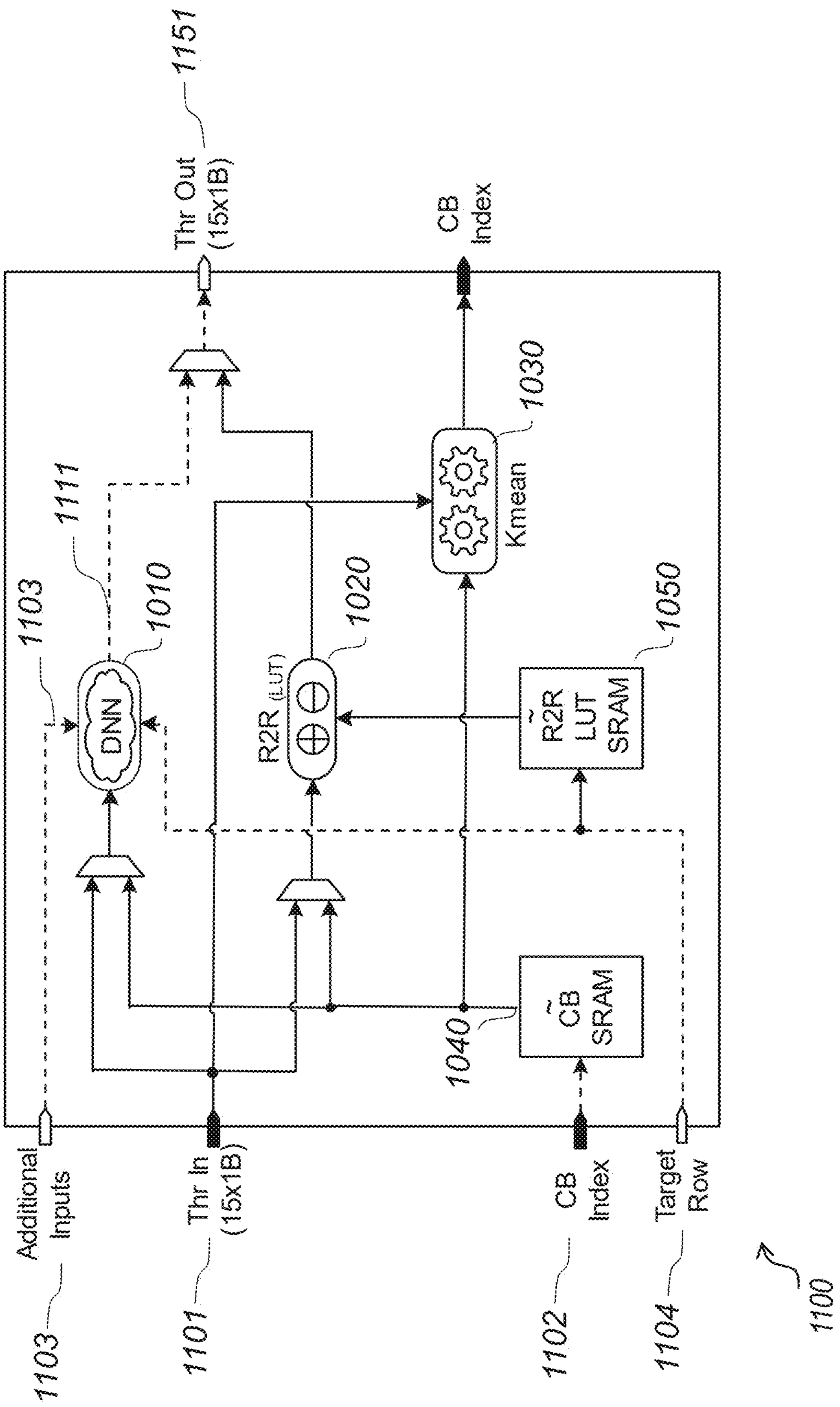
FIG. 11 is a diagram illustrating an example hardware implementations for HT-GET-DNN for a first-phase read operation, according to some arrangements.

FIG. 11 is a diagram illustrating an example hardware implementations for HT-GET-DNN 1100 for a first-phase read operation, according to some arrangements. FIG. 11 shows a flow or a hardware block implementing or activating a R2R-DNN operation (or R2R-DNN engine). Inputs to the hardware block may include a CB index 1102 and/or a target row 1104. Outputs of the hardware block may include read thresholds 1151 for the target row. In some arrangements, an input layer of a DNN 1010 does not include read-thresholds as input features, and instead, the input read thresholds 1101 which are constant, can be embodied or included in other network parameters. In some arrangements, an input layer of a DNN 1010 may include additional parameters 1103 (for example, a cycle count, a row set, temperature(s) at programing and/or reading, etc.). The DNN 1010 can compute read thresholds 1111 of the target row 1104.

Figure 12:
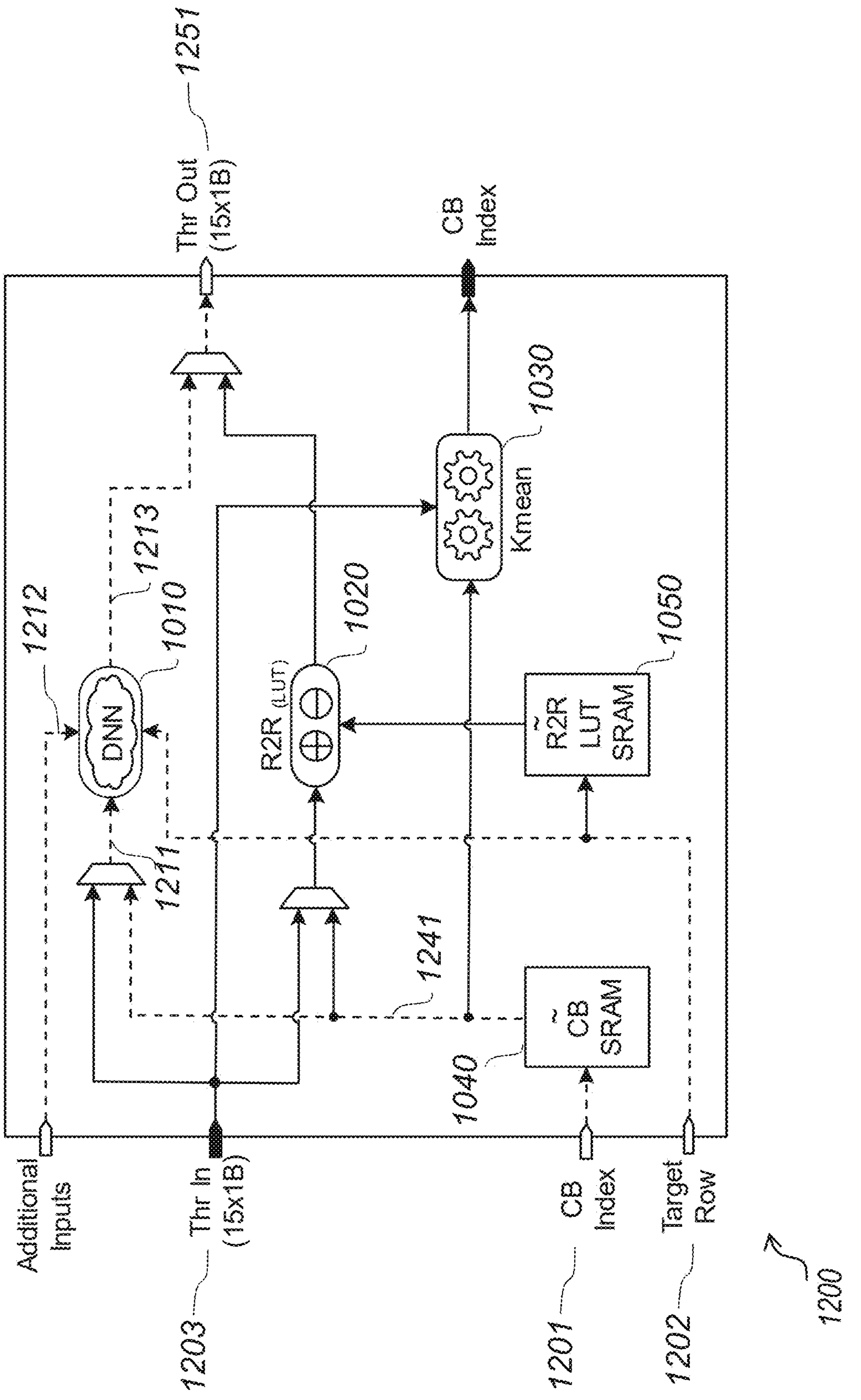
FIG. 12 is a diagram illustrating an example hardware implementations for HT-GET-DNN using HT-codebook (CB) index with R2R DNN for target row thresholds estimation, according to some arrangements.

FIG. 12 is a diagram illustrating an example hardware implementations for HT-GET-DNN 1200 using HT-codebook (CB) index 1101 with R2R DNN for target row thresholds estimation 1251, according to some arrangements. FIG. 12 shows a flow or a hardware block implementing or activating a HT-GET-DNN operation (or a HT-GET-DNN engine). Inputs to the hardware block may include a CB index 1201 and/or a target row 1202. Outputs of the hardware block may include read thresholds 1251 for the target row 1202. In some arrangements, read-thresholds 1241 associated with the reference row can be read from a codebook 1040 according to the CB Index 1201. In some arrangements, an input layer of a DNN 1010 can include reference row read thresholds 1211, and optionally additional parameters 1212 (for example, a cycle count, a row set (a set of rows), temperature(s) at programing and/or reading, etc.). The DNN 1010 can compute read thresholds 1213 of the target row 1202.

Figure 13:
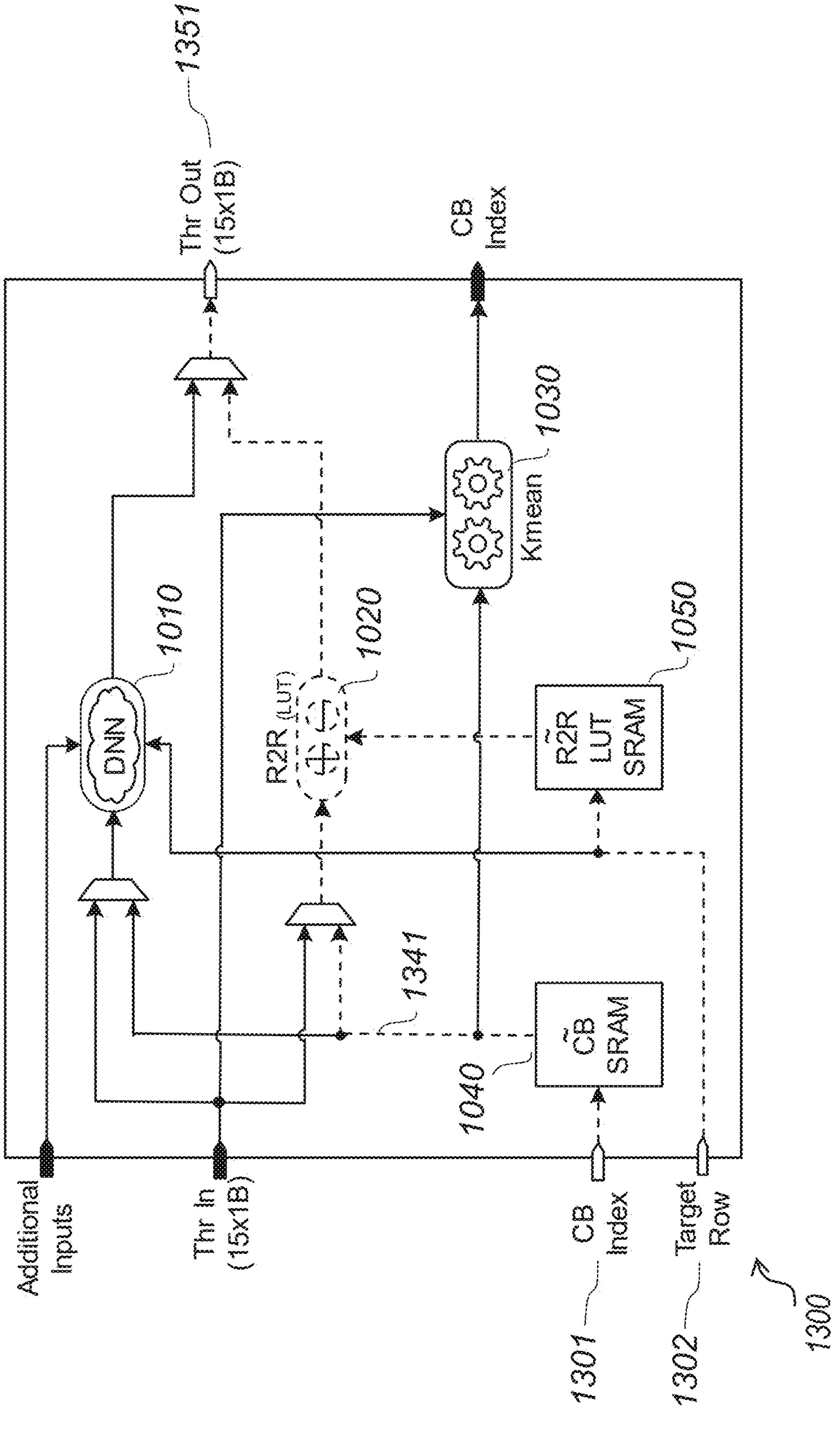
FIG. 13 is a diagram illustrating an example hardware implementations for HT-GET-DNN using HT-CB index with R2R look-up table (LUT), for target row thresholds estimation, according to some arrangements.

FIG. 13 is a diagram illustrating an example hardware implementations for HT-GET-DNN 1300 using HT-CB index 1301 with R2R look-up table (LUT) 1050, for target row thresholds estimation 1351, according to some arrangements. FIG. 13 shows a flow or a hardware block implementing or activating a R2R-LUT based operation (or R2R-LUT engine). Inputs to the hardware block may include a CB index 1301 and/or a target row 1302. In some arrangements, a reference row 1341 can be extracted from a codebook 1040. Outputs of the hardware block may include read thresholds 1351 for the target row. In some arrangements, read thresholds 1341 associated with a reference row (e.g., reference row read thresholds) can be read from a codebook 1040 according to the CB Index 1301. In some arrangements, offsets from the reference row to the target row can be read or obtained from a R2R estimator 1020 according to the target row 1302. In some arrangements, a R2R transformation can be performed based on the reference row read thresholds and the offsets.

Figure 14:
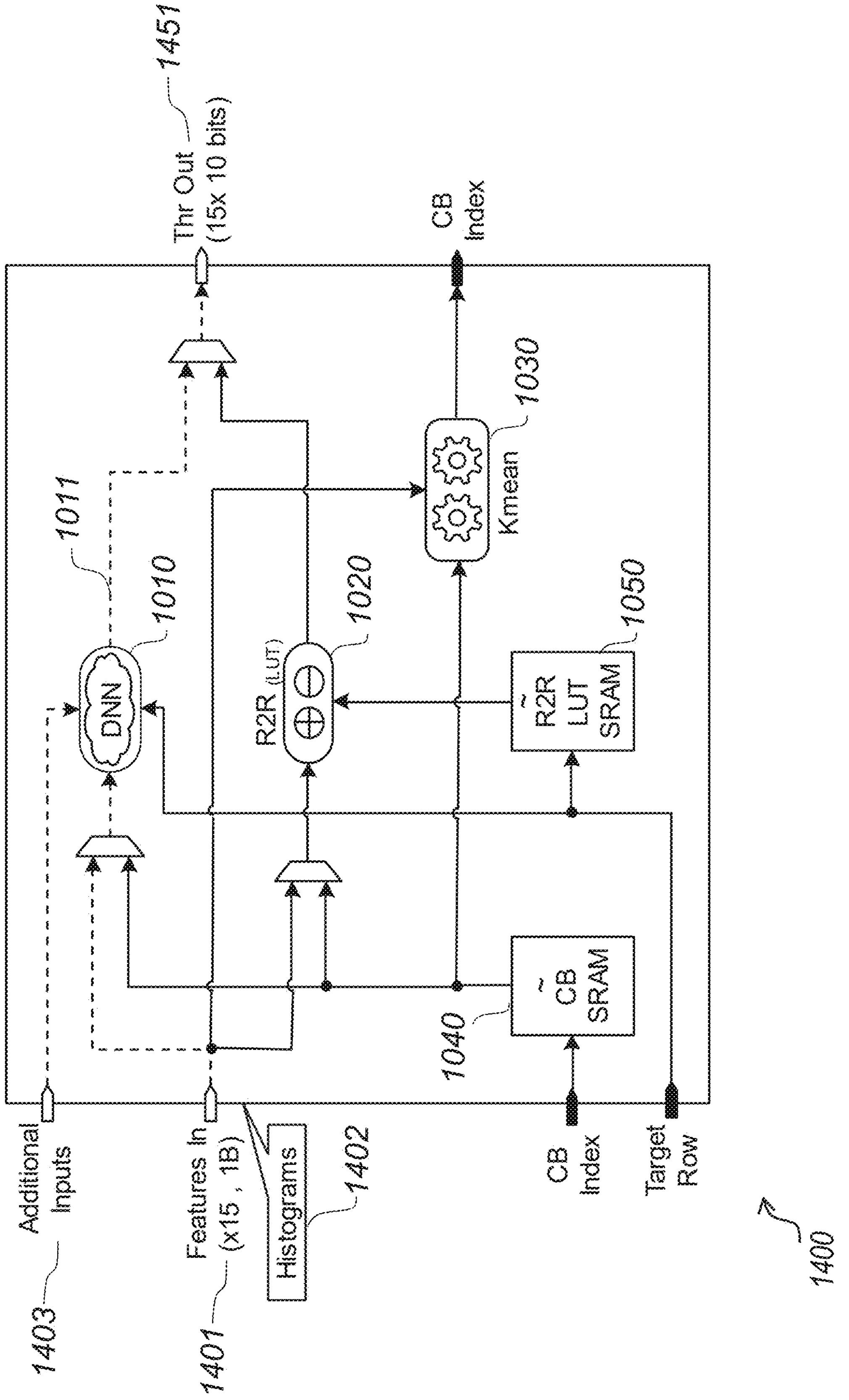
FIG. 14 is a diagram illustrating an example hardware implementations for general DNN operations, according to some arrangements.

FIG. 14 is a diagram illustrating an example hardware implementations for general DNN operations 1400, according to some arrangements. FIG. 14 shows a flow or a hardware block implementing or activating a general DNN operation/engine (e.g., a DNN operation/engine that can be used for a QT-DNN operation). Various DNN operations can be implemented according to different DNN parameters. Inputs to the hardware block may include input features 1401, a network architecture, and/or network parameters. Outputs of the hardware block may include DNN outputs 1411. In some arrangements, the hardware block can execute or perform a QT-DNN operation (or QT-DNN engine) using inputs including QT histograms 1402, and additional inputs 1403 such as a set of rows (row set), a cycle range (optional), and/or temperature(s) at programing and/or reading. Using the inputs, the QT-DNN engine can output QT read thresholds 1451.

Figure 15:
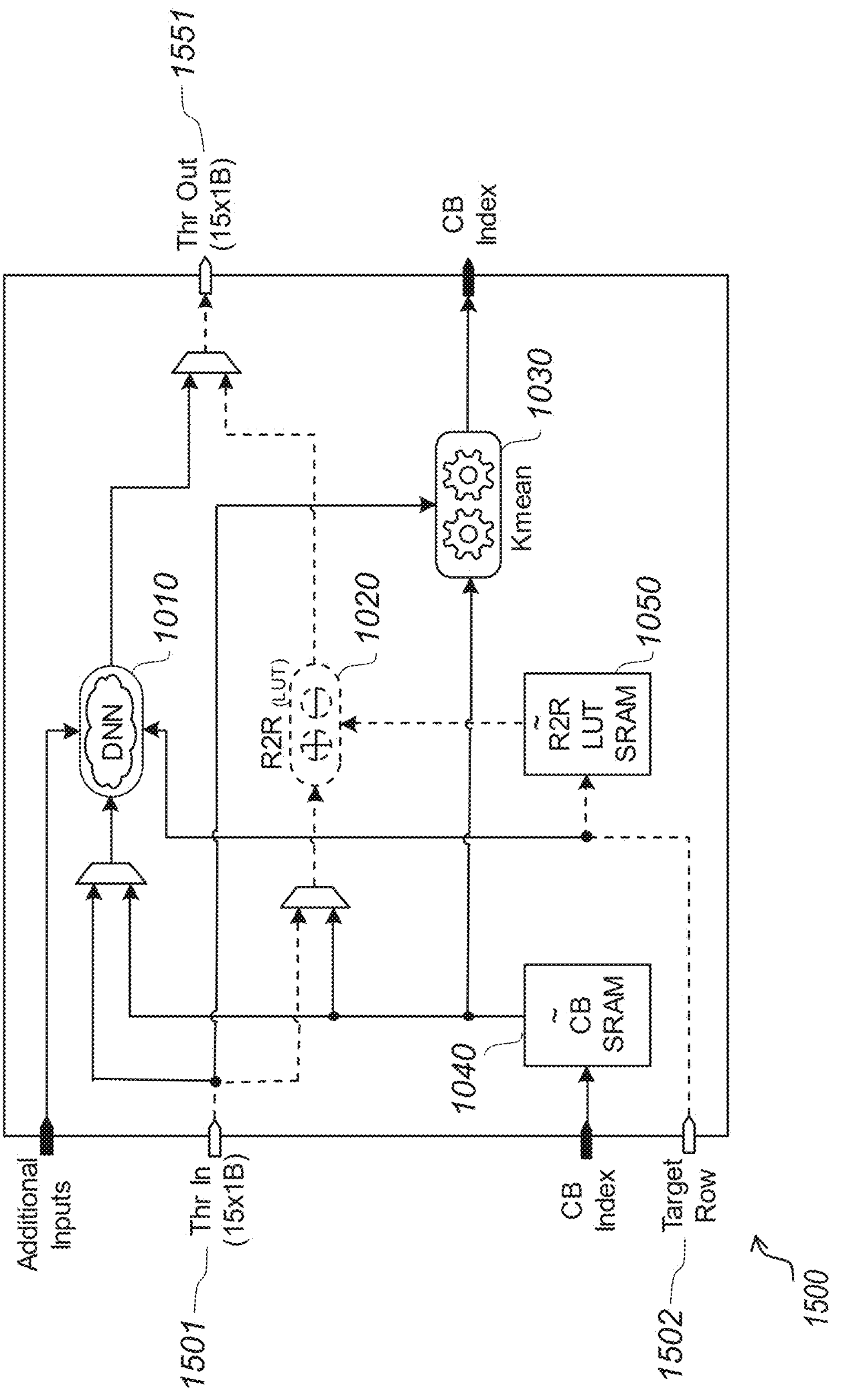
FIG. 15 is a diagram illustrating an example hardware implementations for R2R target-row to reference-row thresholds estimation using LUT, according to some arrangements.

FIG. 15 is a diagram illustrating an example hardware implementations for R2R target-row to reference-row thresholds estimation 1500 using LUT 1050, according to some arrangements. FIG. 15 shows a flow or a hardware block implementing or activating a target-row to reference-row operation (or a target-row to reference-row engine). In some arrangements, the flow shown in FIG. 15 can activates a LUT engine 1020, 1050. Inputs to the hardware block may include target row thresholds 1501 and/or a target row 1502. Outputs of the hardware block may include reference row thresholds 1551. In some arrangements, offsets from the target row to a reference row can be read or obtained from a R2R estimator 1020 according to the target row 1502. In some arrangements, a R2R transformation can be performed based on the target row thresholds and the offsets.

Figure 16:
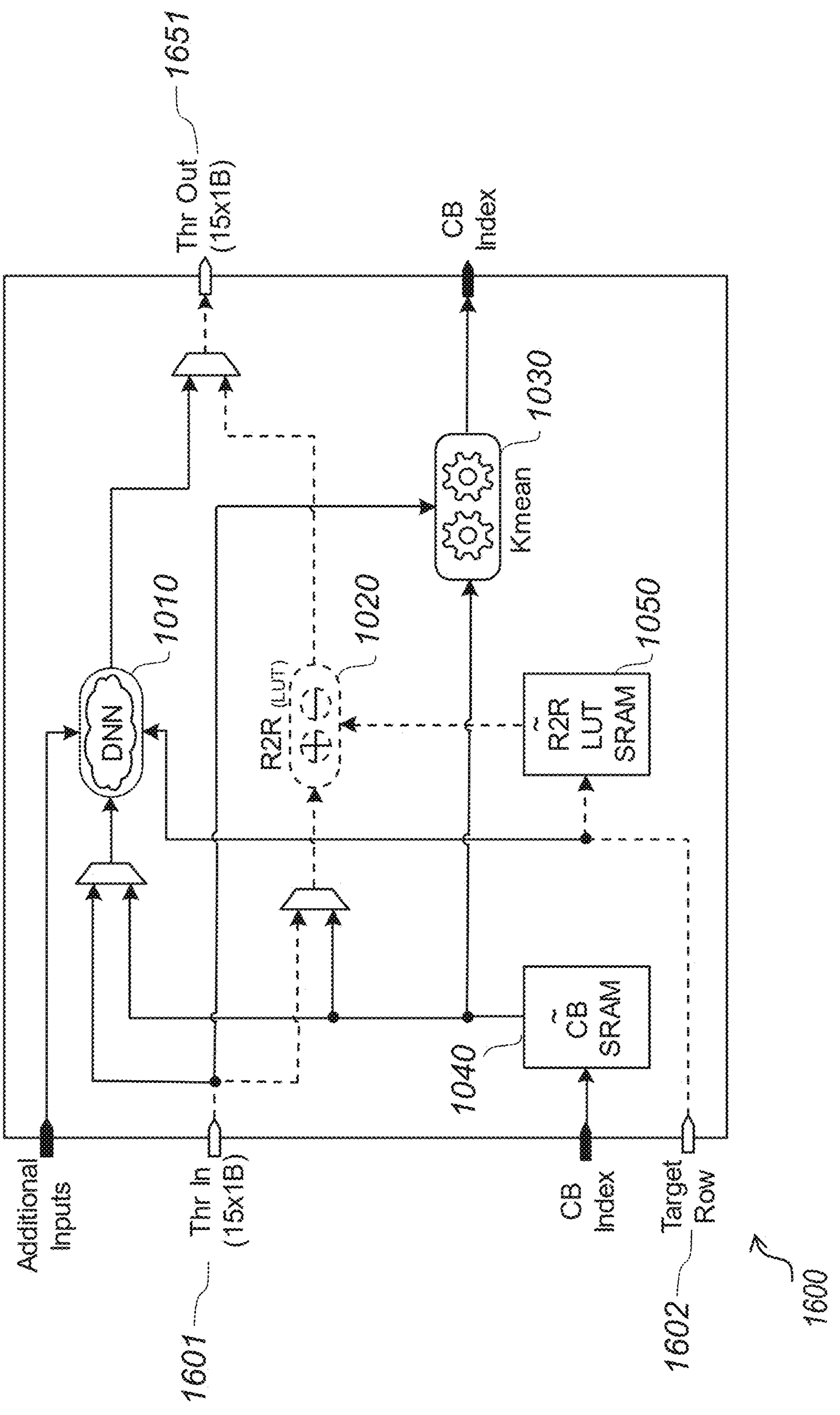
FIG. 16 is a diagram illustrating an example hardware implementations for R2R reference-row to target-Row thresholds estimation using LUT, according to some arrangements.

FIG. 16 is a diagram illustrating an example hardware implementations for R2R reference-row to target-Row thresholds estimation 1600 using LUT 1050, according to some arrangements. FIG. 16 shows a flow or a hardware block implementing or activating a reference-row to target-row operation (or reference-row to target-row engine). Inputs to the hardware block may include reference row thresholds 1601, and a reference row and/or a target row 1602. Outputs of the hardware block may include read thresholds 1651 for the target row 1602.

Figure 17:
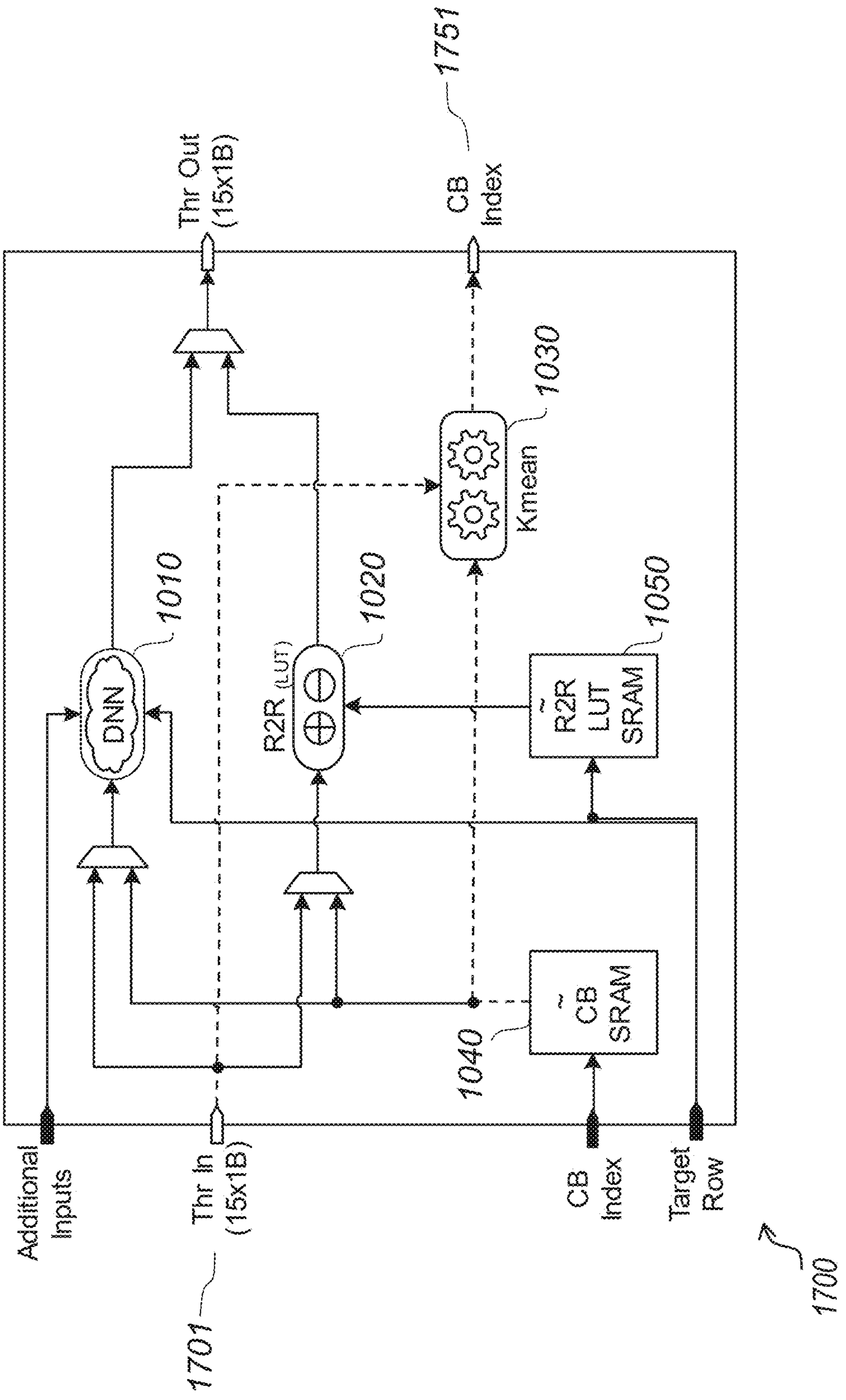
FIG. 17 is a diagram illustrating an example hardware implementations for HT-Set using a K-means search for computing a CB-index given input thresholds, according to some arrangements.
Figure 18B:
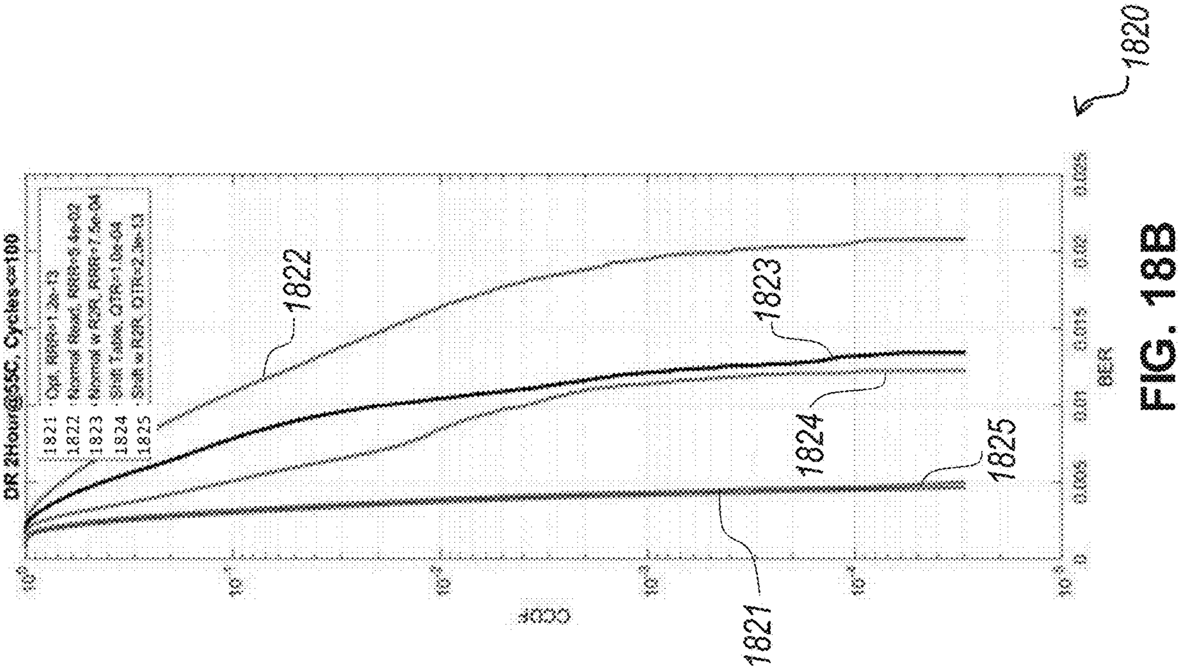
FIG. 18A to FIG. 18D illustrate diagrams illustrating example results of bit error rate (BER) distributions for various stress conditions and different read types, according to some arrangements.
Figure 18A:
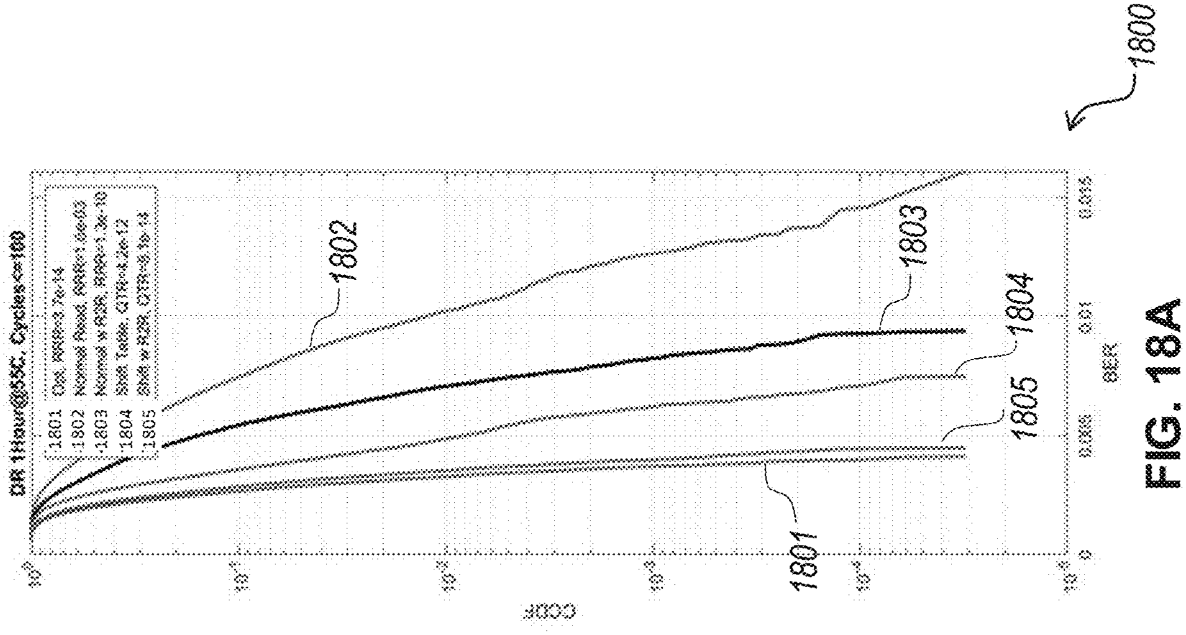
Figure 18D:
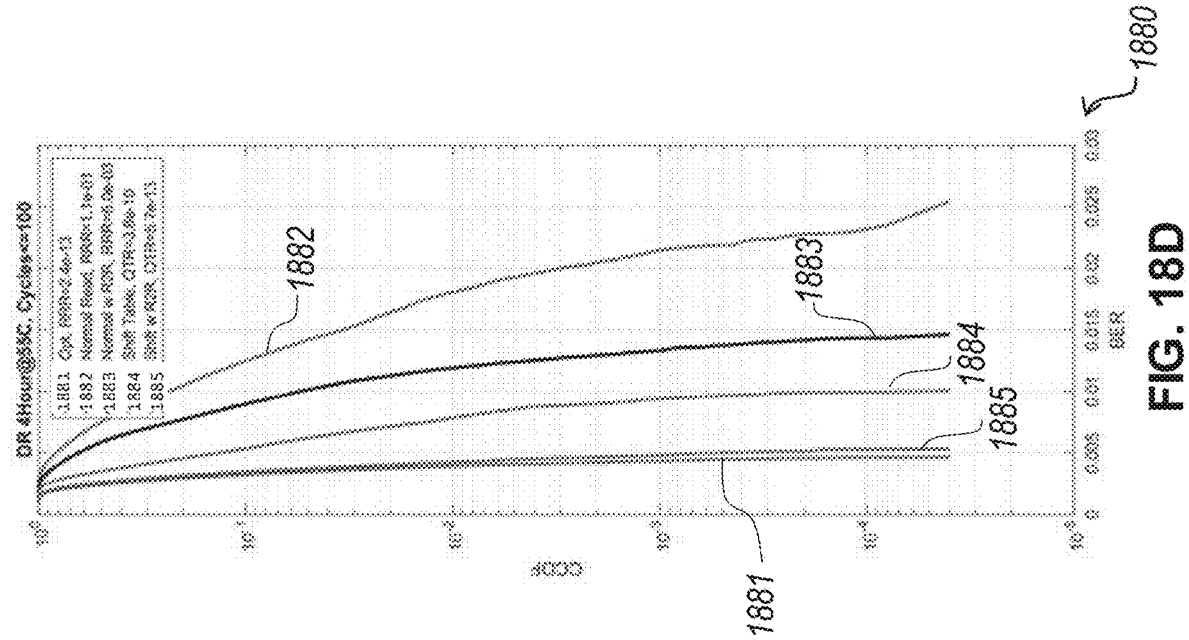
Figure 18C:
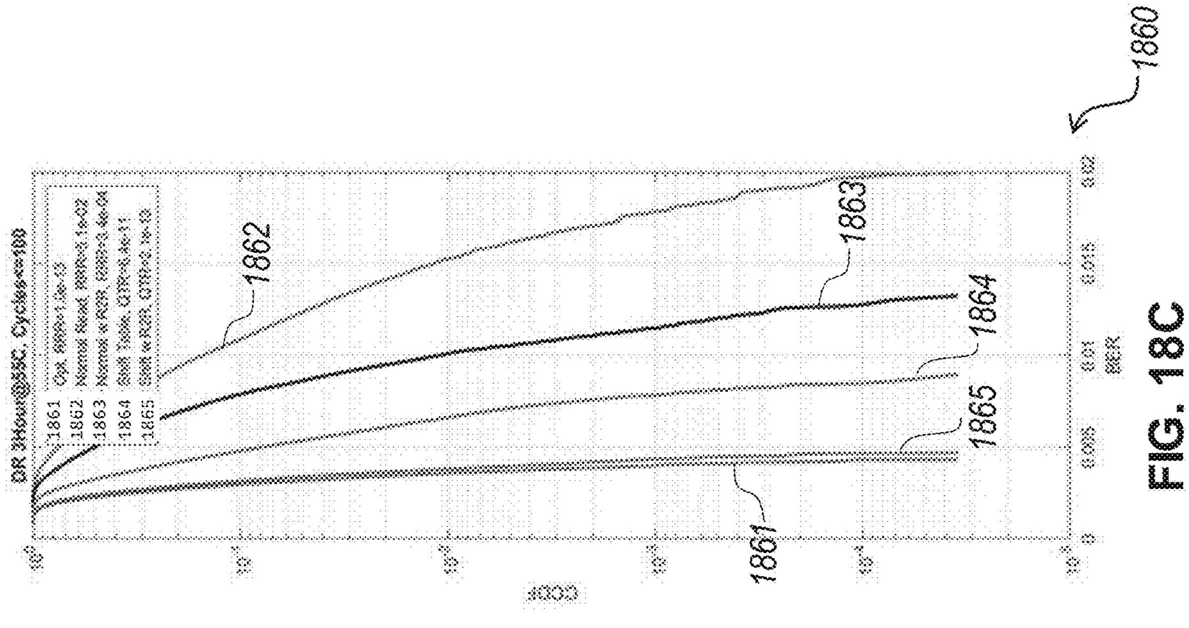

FIG. 17 is a diagram illustrating an example hardware implementations for HT-Set 1700 using a K-means search 1030 for computing a CB-index given input thresholds, according to some arrangements. FIG. 17 shows a flow or a hardware block implementing or activating a K-means search operation (or K-means search engine 1030). Inputs to the hardware block may include reference row thresholds 1701. Outputs of the hardware block may include a CB index 1751. In some arrangements, the K-means engine 1030 can compare the reference row thresholds to all clusters in a codebook 1040 and find the CB-index associated with a best match center-point entry.

TABLE 1

Exemplary performance results of multiple system configurations where read can be performed without using R2R estimation or by two implementations candidates of R2R within read-flow (LinR2R or DNN-R2R).

| | | | Fresh | Non-Stable #Reads = 20K | | | 100K | | |
|---|---|---|---|---|---|---|---|---|---|
| | | # 4 KB Reads: | Performance | No R2R | LinR2R | DNN-R2R | No R2R | LinR2R | DNN-R2R |
| Random | 4 St | HB (600 L) | 184 | 14% | 86% | 100% | 31% | 88% | 100% |
| Read | | SB2 (600 L) | 184 | 27% | 100% | 100% | 57% | 100% | 100% |
| [kIOPS] | 8 St | HB (600 L) | 369 | 5% | 73% | 100% | 13% | 75% | 100% |
| | | SB2 (600 L) | 369 | 12% | 100% | 100% | 26% | 100% | 100% |
| Sequential | 4 St | HB (600 L) | 2887 | 75% | 98% | 100% | 73% | 97% | 100% |
| Read | | SB2 (600 L) | 2887 | 90% | 100% | 100% | 90% | 100% | 100% |
| [MiB/s] | 8 St | HB (600 L) | 5774 | 51% | 94% | 100% | 46% | 95% | 100% |
| | | SB2 (600 L) | 5774 | 71% | 100% | 100% | 72% | 100% | 100% |

| | | 500K | | | Almost-Stable #Reads = 1M | | |
|---|---|---|---|---|---|---|---|
| | | No R2R | LinR2R | DNN-R2R | No R2R | LinR2R | DNN-R2R |
| Random | 4 St | 63% | 95% | 100% | 77% | 97% | 100% |
| Read | | 87% | 100% | 100% | 92% | 100% | 100% |
| [kIOPS] | 8 St | 32% | 85% | 100% | 46% | 90% | 100% |
| | | 61% | 100% | 100% | 76% | 100% | 100% |
| Sequential | 4 St | 74% | 97% | 100% | 77% | 97% | 100% |
| Read | | 90% | 100% | 100% | 91% | 100% | 100% |
| [MiB/s] | 8 St | 49% | 94% | 100% | 52% | 94% | 100% |
| | | 73% | 100% | 100% | 75% | 100% | 100% |

Table 1 demonstrates achievable performance measured on NAND devices with a mild data-retention (DR), which can reflect performance on SOL with a low cycle-count and DR. The performance is evaluated for an exemplary universal flash storage (UFS) controller with a system configuration of 4-stack (4-St) and 8-stack. Evaluation is performed for either random read operation, or sequential read. The maximal system read performance for each configuration is provided in the "Fresh Performance" column. On random reads, the performance is given in units of thousand I/O operations per second (KIOPS), and for sequential reads, the units are MiB/s (mebibytes per second). Two decoding capabilities are compared: (1) HB refers to hard decoding and (2) SB2 refers to the case that all reads are provided with 2-bit resolution, and then fast soft decoding is performed, which can successfully decode in higher BER compared to HB decoding. Performance is measured for three system configurations: (1) NoR2R, (2) Lin-R2R, and (3) DNN-R2R. NoR2R refers to a configuration in which a conventional read-flow is used, where default thresholds are used for first-phase reads on all rows, and also with retry-fixed thresholds-table, same thresholds are used to all rows per retry configuration. "LinR2R" refers to a configuration in which a single linear R2R table is optimized for supporting all stress conditions. The LinR2R table is applied for all types of retry-read (e.g., first-phase retry-read, a retry-fixed thresholds reads (e.g., retry-read using a retry-fixed thresholds table), or post-QT). DNN-R2R refers to a DNN configuration which is optimized per read-type, e.g., for first-phase reads, retry-fixed thresholds reads and even for post-QT. The system performance is evaluated after 20K, 100K, 500K, and 1M read operations of 4 KB data. As may be observed from the results, any conventional system with NoR2R achieves a low read performance due to frequent decoding failures and read-retries. The LinR2R configuration improves on the NoR2R configuration quite significantly, and may achieve full performance on DR if SB2 inputs are available. The DNN-R2R read-flow achieves a full system performance even on HB for all system configurations. The DNN-R2R has the advantages of compact memory requirements, compared to a LUT for LinR2R. In addition, The DNN-R2R can be optimized separately per HT-Get index, e.g., first-phase/shift reads as well as QT.

FIG. 18A to FIG. 18D illustrate diagrams illustrating example results of bit error rate (BER) distributions for various stress conditions and different read types, according to some arrangements. FIG. 18A to FIG. 18D demonstrate the BER distribution according to the type of read used. This is evaluated on a database of VTScans under the following stress conditions: 1 Hrs, 2 Hrs, 3 Hrs and 4 Hrs at 55 C DR for cycle counts up to 100 P/E cycles. The curves 1802, 1822, 1862, 1882 indicates conventional default thresholds reads. When using R2R with first-phase reads according to some arrangements (as indicated by curves 1803, 1823, 1863, 1883), the BER is considerably lower. When evaluating conventional retry-fixed thresholds reads where BER is measured per read as the minimum for all retry-fixed thresholds reads per row, and without R2R (as indicated by curves 1804, 1824, 1864, 1884), the retry rate associated with this fail bit count (FBC) is the probability to activate a QT, which is marked "QTR" in FIG. 18A to FIG. 18D. When performing the retry-fixed thresholds reads with R2R according to some arrangements (as indicated by curves 1805, 1825, 1865, 1885), the BER distribution is much lower. For each type of evaluation the retry probability is computed, and when measuring retry-fixed thresholds read minimal BER, the retry rate reflects the probability that all types of shift-retry fail, and QT is activated. The optimal read BER distribution is also provided for reference (as indicated by curves 1801, 1821, 1861, 1881). As observed from evaluation results, using R2R with retry-fixed thresholds table achieves near optimal BER distribution.

Figure 19:
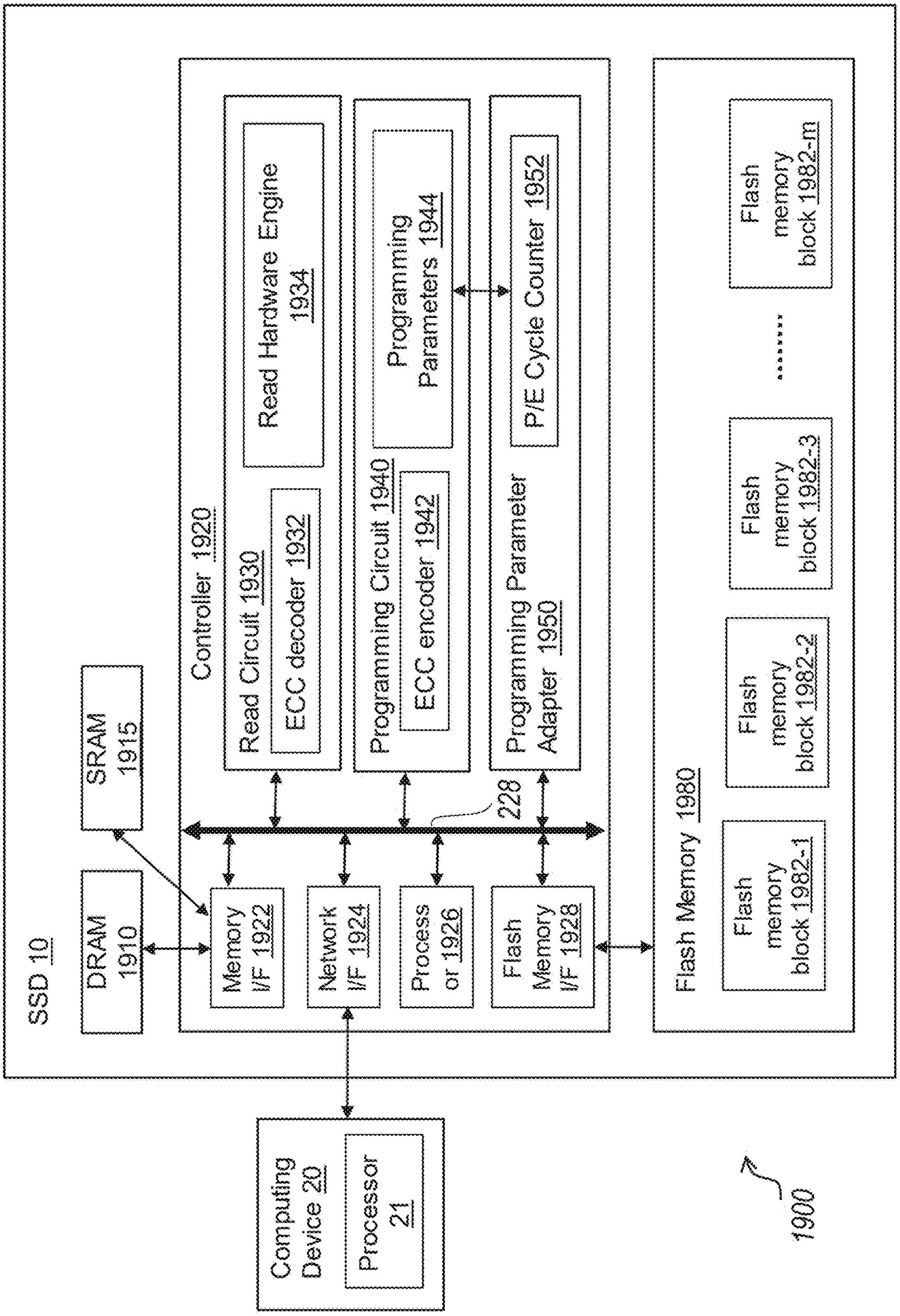
FIG. 19 is a block diagram illustrating an example flash memory system according to some arrangements.

FIG. 19 is a block diagram illustrating an example flash memory system according to some arrangements.

Referring to FIG. 19, a flash memory system 1900 may include a computing device 20 and a solid-state drive (SSD) 10, which is a storage device and may be used as a main storage of an information processing apparatus (e.g., a host computer). The SSD 10 may be incorporated in the information processing apparatus or may be connected to the information processing apparatus via a cable or a network.

The computing device 20 may be an information processing apparatus (computing device). In some arrangements, the computer device 20 which is configured to handle or process data for training and perform a training a neural network (e.g., DNN 300), and the data for training may be collected from a plurality of SSDs by a plurality of computing devices. The data collected from the plurality of SSDs may be recorded and handled/processed by a different computing device, which is not necessarily connected to any of the SSDs and which performs the training based on the collected data. The computing device 20 includes a processor 21 and/or a database system 26. The database system 26 may store read thresholds values including training sets or results of a training.

The SSD 10 includes, for example, a controller 1920 and a flash memory 1980 as non-volatile memory (e.g., a NAND type flash memory). The SSD 10 may include a random access memory which is a volatile memory, for example, DRAM (Dynamic Random Access Memory) 1910 and/or SRAM (Static Random Access Memory) 1915. The random access memory has, for example, a read buffer which is a buffer area for temporarily storing data read out from the flash memory 1980, a write buffer which is a buffer area for temporarily storing data written in the flash memory 1980, and a buffer used for a garbage collection. In some arrangements, the controller 1920 may include DRAM or SRAM.

In some arrangements, the flash memory 1980 may include a memory cell array which includes a plurality of flash memory blocks (e.g., NAND blocks) 1982-1 to **1982-*m*. Each of the blocks 1982-1 to 1982-*m* may function as an erase unit. Each of the blocks 1982-1 to 1982-*m* includes a plurality of physical pages. In some arrangements, in the flash memory 1980**, data reading and data writing are executed on a page basis, and data erasing is executed on a block basis.

In some arrangements, the controller 1920 may be a memory controller configured to control the flash memory 1980. The controller 1920 includes, for example, a processor (e.g., CPU) 1926, a flash memory interface 1928, and a memory interface 1922, a network interface 1924, all of which may be interconnected via a bus 1928. The memory interface 1922 may include a DRAM controller configured to control an access to the DRAM 1910, and a SRAM controller configured to control an access to the SRAM 1915. The flash memory interface 1928 may function as a flash memory control circuit (e.g., NAND control circuit) configured to control the flash memory 1980 (e.g., NAND type flash memory). The network interface 1924 may function as a circuit which receives various data from the computing device 20 and transmits data to the computing device 20. The data may include a plurality of sets of read thresholds or other data collected from the flash memory 1980 or a plurality of SSDs for training a neural network (e.g., DNN 300).

The controller 1920 may include a read circuit 1930, a programming circuit (e.g. a program DSP) 1940, and/or a programming parameter adapter 1950. As shown in FIG. 19, the adapter 1950 can adapt the programming parameters 1944 used by programming circuit 1940 as described above. The adapter 1950 in this example may include a Program/Erase (P/E) cycle counter 1952. Although shown separately for ease of illustration, some or all of the adapter 1950 can be incorporated in the programming circuit 1940. In some arrangements, the read circuit 230 may include an ECC decoder 1932 and a read hardware engine 1934 (e.g., system 500, system 600, RdDSP HW engine 820, DNN-based R2R estimator 900, hardware engine 1000). In some arrangements, the programming circuit 1940 may include an ECC encoder 1942. Arrangements of memory controller 1920 can include additional or fewer components such as those shown in FIG. 19.

In some arrangements, a flash memory system (e.g., flash memory system 1900) may include a non-volatile memory (e.g., flash memory 1980) and a circuit (e.g., read circuit 1930, programming circuit 1940, programming parameter adapter 1950). The non-volatile memory may include one or more blocks (e.g., blocks 1982-1, . . . , **1982-*m*), each block including a plurality of rows of cells. The circuit for performing operations on the non-volatile memory, may be configured to obtain a row identifier identifying a row of a target page (e.g., target row 1002), among the plurality of rows. The circuit may be configured to generate, by a machine learning model (e.g., DNN 300, 1010), one or more voltage thresholds for a read operation (e.g., voltage thresholds 1051), based on the row identifier (e.g., row identifier corresponding to the target row 1002**). The circuit may be configured to perform the read operation on the target page of the non-volatile memory with the one or more voltage thresholds.

In some arrangements, the circuit may be further configured to obtain a shift index (e.g., shift index or HT index 515, CB index 1003) corresponding to a subset of one or more stress conditions and defining a shift to default voltage thresholds. The one or more voltage thresholds for the read operation may be generated by the machine learning model (e.g., DNN 300, 1010) based on the shift index and the row identifier. The one or more stress conditions may include at least one of read disturb, data retention loss, temperature variations, mechanical stress, or error rate stress.

In some arrangements, in generating the one or more voltage thresholds (e.g., output voltage threshold 1051), the circuit may be configured to generate, by the machine learning model, a look-up table (e.g., LUT 1050) storing a plurality of voltage thresholds for each row. The circuit may be configured to generate, using the look-up table, the one or more voltage thresholds, based on the shift index and the row identifier. The one or more voltage thresholds can be generated by calculating a sum of (1) a first voltage threshold shifted by the shift from a default voltage threshold and (2) a second voltage threshold corresponding to the row identifier (see Equation 1, Equation 2).

In some arrangements, in generating the one or more voltage thresholds, the circuit may be configured to receive, as an input feature of the machine learning model, the shift index and the row identifier. In response to receiving the shift index and the row identifier, the circuit may be configured to output, by the machine learning model, the one or more voltage thresholds (see Equation 3).

In some arrangements, in generating the one or more voltage thresholds (e.g., output voltage thresholds 1051), the circuit may be configured to receive, as an input feature of the machine learning model (e.g., DNN 1010), the shift index (e.g., CB index 1201), the row identifier (e.g., target row 1202), and one or more voltage thresholds (e.g., voltage thresholds 1203) extracted from a history table (e.g., history table 510). The history table may store a plurality of voltage thresholds per block that are historically used and result in a decode success. The shift index may be an index to the history table. In response to receiving the shift index, the row identifier and the one or more voltage thresholds, the circuit may be configured to output, by the machine learning model (e.g., DNN 1010), the one or more voltage thresholds (e.g., voltage thresholds 1213).

In some arrangements, in generating the one or more voltage thresholds, the circuit may be configured to receive, from a look-up table, the row identifier as an input feature of the machine learning model. The look-up table may store entity embedding values per row. The row identifier may be represented by one or more entity embedding values from the look-up table. In response to receiving the row identifier, the circuit may be configured to output, by the machine learning model, the one or more voltage thresholds.

In some arrangements, before generating the one or more voltage thresholds, the circuit may be configured to train the machine learning model (e.g., DNN 300, DNN 1010) with respect to a reference row among the plurality of rows. In training the machine learning model, the circuit may be configured to determine the reference row. The circuit may be configured to obtain sample data representing voltage thresholds associated a number of retries for the reference row. The circuit may be configured to calculate a read retry rate (RRR) using the sample data. The RRR may indicate a rate of a read retry that occurs when decoding of data fails. The circuit may be configured to update the machine learning model to minimize the RRR.

In some arrangements, in determining the reference row, for each pair of rows among the plurality of rows in each of the one or more blocks, the circuit may be configured to calculate a distance between a voltage threshold of one row of the pair and a voltage threshold of the other row of the pair. The circuit may be configured to calculate, based on a result of calculating the distance, a variance of distances calculated for each pair of rows. The circuit may be configured to calculate, based on a result of calculating the variance of distances, an average variance of distances for each row in the one or more blocks. The circuit may be configured to identify, as the reference row, a row with a smallest average variance of distances among the plurality of rows.

In some arrangements, before generating the one or more voltage thresholds, the circuit may be further configured to train the machine learning model (e.g., DNN 300) that includes a plurality of layers and a plurality of neurons (e.g., neurons 305) per layer. In training the machine learning model, the circuit may be configured to obtain sample data including a one-hot input of row identifier fully connected to one or more neurons. The circuit may be configured to calculate a retry probability using the sample data. The retry probability may indicate a probability of a read retry that occurs when decoding of data fails. The circuit may be configured to update the machine learning model to minimize the retry probability.

Figure 20:
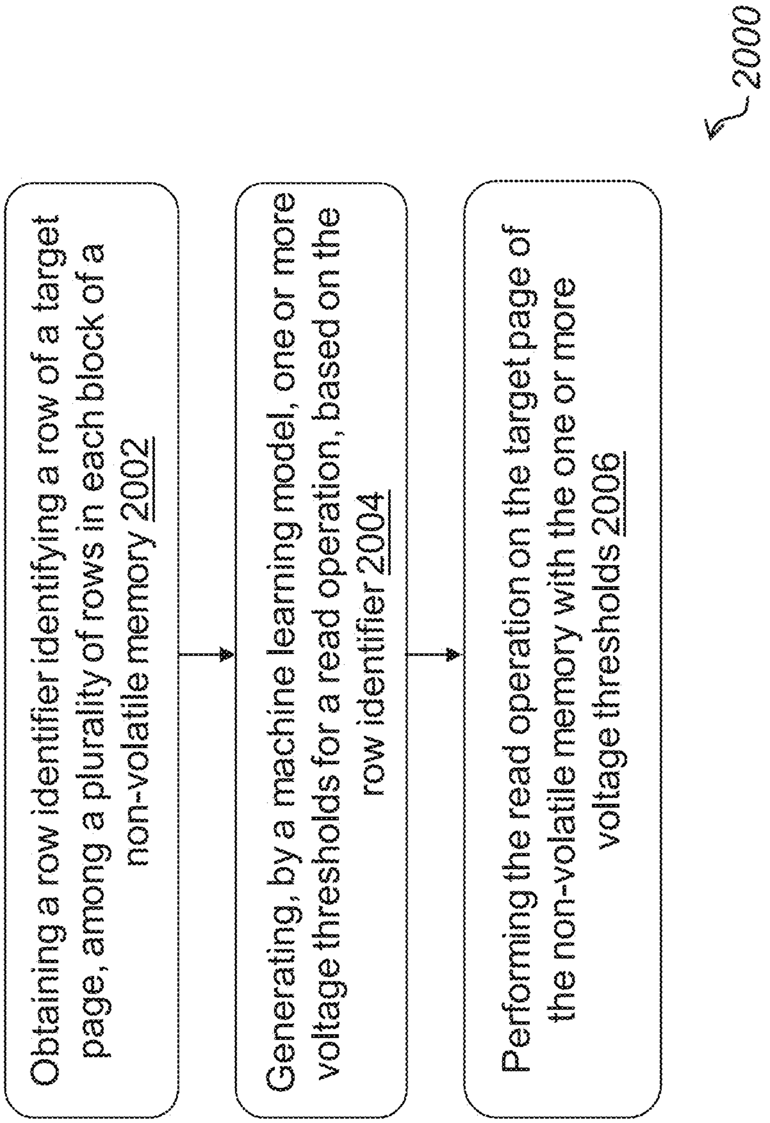
FIG. 20 is a flowchart illustrating an example methodology for dynamically adapting read thresholds based on per row optimal thresholds characterization, according to some arrangements.

FIG. 20 is a flowchart illustrating an example methodology for dynamically adapting read thresholds based on per row optimal thresholds characterization, according to some arrangements. In some arrangements, the example methodology relates to a process 2000 for performing operations on a non-volatile memory (e.g., flash memory 1980) including one or more blocks (e.g., blocks 1982-1, . . . , 1982-*m*), each block including a plurality of rows of cells.

In this example, the process 2000 begins in step S2002 by obtaining a row identifier identifying a row of a target page (e.g., row identifier corresponding to the target row 1002), among the plurality of rows.

In step S2004, in some arrangements, a machine learning model (e.g., DNN 300, 1010) may generate one or more voltage thresholds (e.g., output voltage threshold 1051) for a read operation, based on the row identifier.

In some arrangements, a shift index corresponding to a subset of one or more stress conditions and defining a shift to default voltage thresholds may be obtained. The one or more voltage thresholds for the read operation (e.g., output voltage threshold 1051) may be generated by the machine learning model based on the shift index and the row identifier. The one or more stress conditions may include at least one of read disturb, data retention loss, temperature variations, mechanical stress, or error rate stress.

In some arrangements, in generating the one or more voltage thresholds, the machine learning model may generate a look-up table (e.g., LUT 1050) storing a plurality of voltage thresholds for each row. The one or more voltage thresholds may be generated based on the shift index and the row identifier, using the look-up table. The one or more voltage thresholds can be generated by calculating a sum of (1) a first voltage threshold shifted by the shift from a default voltage threshold and (2) a second voltage threshold corresponding to the row identifier (see Equation 1, Equation 2).

In some arrangements, in generating the one or more voltage thresholds, the shift index and the row identifier may be received as an input feature of the machine learning model. In response to receiving the shift index and the row identifier, the machine learning model may output the one or more voltage thresholds (see Equation 3).

In some arrangements, in generating the one or more voltage thresholds, the shift index (e.g., CB index 1201), the row identifier (e.g., target row 1202), and one or more voltage thresholds (e.g., voltage thresholds 1203) extracted from a history table (e.g., history table 510) may be received as an input feature of the machine learning model. The history table may store a plurality of voltage thresholds per block that are historically used and result in a decode success. The shift index may be an index to the history table. In response to receiving the shift index, the row identifier and the one or more voltage thresholds, the machine learning model (e.g., DNN 1010) may output the one or more voltage thresholds (e.g., voltage thresholds 1213).

In some arrangements, in generating the one or more voltage thresholds, the row identifier may be received, from a look-up table, as an input feature of the machine learning model. The look-up table may store entity embedding values per row. The row identifier may be represented by one or more entity embedding values from the look-up table. In response to receiving the row identifier, the machine learning model may output the one or more voltage thresholds.

In step S1906, in some arrangements, the read operation may be performed on the target page of the non-volatile memory with the one or more voltage thresholds.

In some arrangements, before generating the one or more voltage thresholds, the machine learning model (e.g., DNN 300, DNN 1010) may be trained with respect to a reference row among the plurality of rows. In training the machine learning model, the reference row may be determined. Sample data representing voltage thresholds associated a number of retries for the reference row may be obtained. A read retry rate (RRR) may be calculated using the sample data. The RRR may indicate a rate of a read retry that occurs when decoding of data fails. The machine learning model may be updated to minimize the RRR.

In some arrangements, in determining the reference row, for each pair of rows among the plurality of rows in each of the one or more blocks, a distance between a voltage threshold of one row of the pair and a voltage threshold of the other row of the pair may be calculated. Based on a result of calculating the distance, a variance of distances calculated for each pair of rows may be calculated. Based on a result of calculating the variance of distances, an average variance of distances for each row in the one or more blocks may be calculated. A row with a smallest average variance of distances among the plurality of rows may be identified as the reference row.

In some arrangements, before generating the one or more voltage thresholds, the machine learning model (e.g., DNN 300) that includes a plurality of layers and a plurality of neurons (e.g., neurons 305) per layer, may be trained. In training the machine learning model, sample data including a one-hot input of row identifier fully connected to one or more neurons may be obtained. A retry probability may be calculated using the sample data. The retry probability may indicate a probability of a read retry that occurs when decoding of data fails. The machine learning model may be updated to minimize the retry probability.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations on a non-volatile memory comprising one or more blocks, each block comprising a plurality of rows of cells, the method comprising:

obtaining a row identifier identifying a row of a target page, among the plurality of rows;

generating, by a machine learning model, one or more voltage thresholds for a read operation, based on the row identifier; and performing the read operation on the target page of the non-volatile memory with the one or more voltage thresholds.

2. The method of claim 1, further comprising:

obtaining a shift index corresponding to a subset of one or more stress conditions and defining a shift to default voltage thresholds, wherein the one or more voltage thresholds for the read operation is generated by the machine learning model based on the shift index and the row identifier, wherein the one or more stress conditions comprise at least one of read disturb, data retention loss, temperature variations, mechanical stress, or error rate stress.

3. The method of claim 2, wherein generating the one or more voltage thresholds comprises:

generating, by the machine learning model, a look-up table storing a plurality of voltage thresholds for each row; and generating, using the look-up table, the one or more voltage thresholds, based on the shift index and the row identifier.

4. The method of claim 3, wherein the one or more voltage thresholds can be generated by calculating a sum of (1) a first voltage threshold shifted by the shift from a default voltage threshold and (2) a second voltage threshold corresponding to the row identifier.

5. The method of claim 2, wherein generating the one or more voltage thresholds comprises:

receiving, as an input feature of the machine learning model, the shift index and the row identifier; and in response to receiving the shift index and the row identifier, outputting, by the machine learning model, the one or more voltage thresholds.

6. The method of claim 2, wherein generating the one or more voltage thresholds comprises:

receiving, as an input feature of the machine learning model, the shift index, the row identifier, and one or more voltage thresholds extracted from a history table, wherein the history table stores a plurality of voltage thresholds per block that are historically used and result in a decode success, and the shift index is an index to the history table; and in response to receiving the shift index, the row identifier and the one or more voltage thresholds, outputting, by the machine learning model, the one or more voltage thresholds.

7. The method of claim 1, wherein generating the one or more voltage thresholds comprises:

receiving, from a look-up table, the row identifier as an input feature of the machine learning model, wherein the look-up table stores entity embedding values per row, and the row identifier is represented by one or more entity embedding values from the look-up table; and in response to receiving the row identifier, outputting, by the machine learning model, the one or more voltage thresholds.

8. The method of claim 1, further comprising:

before generating the one or more voltage thresholds, training the machine learning model with respect to a reference row among the plurality of rows, wherein training the machine learning model comprises:

determining the reference row;

obtaining sample data representing voltage thresholds associated a number of retries for the reference row;

calculating a read retry rate (RRR) using the sample data, wherein the RRR indicates a rate of a read retry that occurs when decoding of data fails; and updating the machine learning model to minimize the RRR.

9. The method of claim 8, wherein determining the reference row comprises:

for each pair of rows among the plurality of rows in each of the one or more blocks, calculating a distance between a voltage threshold of one row of the pair and a voltage threshold of the other row of the pair;

calculating, based on a result of calculating the distance, a variance of distances calculated for each pair of rows;

calculating, based on a result of calculating the variance of distances, an average variance of distances for each row in the one or more blocks; and identifying, as the reference row, a row with a smallest average variance of distances among the plurality of rows.

10. The method of claim 1, further comprising:

before generating the one or more voltage thresholds, training the machine learning model that includes a plurality of layers and a plurality of neurons per layer, wherein training the machine learning model comprises:

obtaining sample data including a one-hot input of row identifier fully connected to one or more neurons;

calculating a retry probability using the sample data, wherein the retry probability indicates a probability of a read retry that occurs when decoding of data fails; and updating the machine learning model to minimize the retry probability.

11. A flash memory system comprising:

a non-volatile memory comprising one or more blocks, each block comprising a plurality of rows of cells; and a circuit for performing operations on the non-volatile memory, the circuit being configured to:

obtain a row identifier identifying a row of a target page, among the plurality of rows;

generate, by a machine learning model, one or more voltage thresholds for a read operation, based on the row identifier; and perform the read operation on the target page of the non-volatile memory with the one or more voltage thresholds.

12. The flash memory system of claim 11, wherein the circuit is further configured to:

obtain a shift index corresponding to a subset of one or more stress conditions and defining a shift to default voltage thresholds, wherein the one or more voltage thresholds for the read operation is generated by the machine learning model based on the shift index and the row identifier, wherein the one or more stress conditions comprise at least one of read disturb, data retention loss, temperature variations, mechanical stress, or error rate stress.

13. The flash memory system of claim 12, wherein in generating the one or more voltage thresholds, the circuit is configured to:

generate, by the machine learning model, a look-up table storing a plurality of voltage thresholds for each row; and generate, using the look-up table, the one or more voltage thresholds, based on the shift index and the row identifier.

14. The flash memory system of claim 13, wherein the one or more voltage thresholds can be generated by calculating a sum of (1) a first voltage threshold shifted by the shift from a default voltage threshold and (2) a second voltage threshold corresponding to the row identifier.

15. The flash memory system of claim 12, wherein in generating the one or more voltage thresholds, the circuit is configured to:

receive, as an input feature of the machine learning model, the shift index and the row identifier; and in response to receiving the shift index and the row identifier, output, by the machine learning model, the one or more voltage thresholds.

16. The flash memory system of claim 12, wherein in generating the one or more voltage thresholds, the circuit is configured to:

receive, as an input feature of the machine learning model, the shift index, the row identifier, and one or more voltage thresholds extracted from a history table, wherein the history table stores a plurality of voltage thresholds per block that are historically used and result in a decode success, and the shift index is an index to the history table; and in response to receiving the shift index, the row identifier and the one or more voltage thresholds, output, by the machine learning model, the one or more voltage thresholds.

17. The flash memory system of claim 11, wherein in generating the one or more voltage thresholds, the circuit is configured to:

receive, from a look-up table, the row identifier as an input feature of the machine learning model, wherein the look-up table stores entity embedding values per row, and the row identifier is represented by one or more entity embedding values from the look-up table; and in response to receiving the row identifier, output, by the machine learning model, the one or more voltage thresholds.

18. The flash memory system of claim 11, wherein the circuit is further configured to:

before generating the one or more voltage thresholds, train the machine learning model with respect to a reference row among the plurality of rows, wherein training the machine learning model comprises:

determining the reference row;

obtaining sample data representing voltage thresholds associated a number of retries for the reference row;

calculating a read retry rate (RRR) using the sample data, wherein the RRR indicates a rate of a read retry that occurs when decoding of data fails; and updating the machine learning model to minimize the RRR.

19. The flash memory system of claim 18, wherein in determining the reference row, the circuit is configured to:

for each pair of rows among the plurality of rows in each of the one or more blocks, calculate a distance between a voltage threshold of one row of the pair and a voltage threshold of the other row of the pair;

calculate, based on a result of calculating the distance, a variance of distances calculated for each pair of rows;

calculate, based on a result of calculating the variance of distances, an average variance of distances for each row in the one or more blocks; and identify, as the reference row, a row with a smallest average variance of distances among the plurality of rows.

20. The flash memory system of claim 11, wherein the circuit is further configured to:

before generating the one or more voltage thresholds, train the machine learning model that includes a plurality of layers and a plurality of neurons per layer, wherein training the machine learning model comprises:

obtaining sample data including a one-hot input of row identifier fully connected to one or more neurons;

calculating a retry probability using the sample data, wherein the retry probability indicates a probability of a read retry that occurs when decoding of data fails; and updating the machine learning model to minimize the retry probability.

* * * * *